United States Patent [19]

Sato et al.

[11] Patent Number: 4,984,201
[45] Date of Patent: Jan. 8, 1991

[54] SEMICONDUCTOR STORAGE DEVICE WITH COMMON DATA LINE STRUCTURE

[75] Inventors: Yoichi Sato, Iruma; Masao Mizukami, Yokohama, both of Japan

[73] Assignees: Hitachi, Ltd.; Hitachi VLSI Engineering Corp., both of Tokyo, Japan

[21] Appl. No.: 465,983

[22] Filed: Jan. 16, 1990

[30] Foreign Application Priority Data

Jan. 13, 1989 [JP] Japan ................................. 1-7146

[51] Int. Cl.$^5$ ..................... G11C 11/40; G11C 11/407; G11C 7/00
[52] U.S. Cl. .................................... 365/154; 365/203; 365/51; 365/189.01
[58] Field of Search ............ 365/154, 203, 51, 189.01, 365/189.04, 207, 230.05

[56] References Cited

U.S. PATENT DOCUMENTS 4,768,172  8/1988  Sasaki ............................... 365/154 X
4,802,122  1/1989  Avvinen et al. .................... 365/154
4,807,194  2/1989  Yamada et al. .................... 365/51 X Primary Examiner—Alyssa H. Bowler
Attorney, Agent, or Firm—Antonelli, Terry, Stout & Kraus

[57] ABSTRACT

Each memory cell of the memory array has a latch circuit, such as a pair of cross-connected CMOS inverters, for storing information, a first switch MOSFET whose gate is connected with a word line, and a second switch MOSFET which is connected in series with the first switch MOSFET and the gate of which is connected with the output terminal of the latch circuit. The first and second switch MOSFETs are coupled between the data line and a terminal supplied with a first power source voltage level, such as reference ground potential. Such memory cells are disposed at intersections of a plurality of data lines and a plurality of word lines. One of the plurality of data lines is connected with a common data line through a column switch which is alternatively brought into an ON state. Prior to a reading operation, the data lines are precharged to the first power-source voltage level, or ground potential, and the common data line is precharged to a second power-source voltage level, such as the supply voltage of the memory.

28 Claims, 8 Drawing Sheets

4,984,201

SEMICONDUCTOR STORAGE DEVICE WITH COMMON DATA LINE STRUCTURE

BACKGROUND OF THE INVENTION

The present invention relates to a semiconductor storage device and, more particularly, to a technology effective in particular for use in an on-chip static RAM (random access memory) mounted on a large-scale logical integrated circuit device and the like. As to a static RAM in which it is arranged such that only a single latch circuit for storing information is coupled with its corresponding data line, i.e., a static RAM having a memory array of a single memory cell selection type, there is, for example, a disclosure in Japanese Provisional Publication No. 54-34726. In this patent publication, there is further proposed a method in which one of the complementary data lines is commonly owned by a pair of adjoining columns of memory cells.

The design of the memory array in the single memory cell selection type lowers power consumption but, on the other hand, there is an increase in the number of MOSFETs being used for the selection. Hence, such a memory cell array type would make it difficult to achieve a higher level of circuit integration.

SUMMARY OF THE INVENTION

An object of the present invention is to provide semiconductor storage devices such as a static RAM in which lowering of the power consumption and reduction in the required layout area are achieved and to provide various memory arrays and single-ended type sense amplifiers suitable for us in such devices. Another object of the present invention is to lower the power consumption in and reduce the cost of a large-scale logical integrated circuit device and the like mounting a static RAM thereon.

The above and other objects and novel features of the present invention will become more fully understood from the following description taken in connection with the accompanying drawings.

A representative aspect of the invention disclosed herein will be summarized in the following. The data lines constituting a memory array of a static RAM or the like are changed from those of a complementary data line system to those of a single, or unitized, data line system and, in addition, the sense amplifier to which such data line is selectively coupled is arranged as a single-ended type. Each memory cell in the memory array includes a latch circuit for storing information, a first switch IGFET, e.g. MISFET or MOSFET, whose gate is coupled with a word line and a second switch IGFET (MISFET or MOSFET) which is connected in series with the first switch IGFET (MISFET or MOSFET) and of which the gate thereof is connected with the output terminal of the latch circuit. The first and second switch IGFETs are connected between the data line and reference potential supply terminal, e.g. a ground potential supply terminal. At the intersections of a plurality of data lines and a plurality of word lines, there are respectively disposed the memory cells. One out of the plurality of data lines is connected to a common data line through a column switch so as to be alternatively brought to an ON state. Prior to a read operation, each data line is precharged to the reference potential, such as ground potential, while the common data line is precharged, for example, to a relatively more positive voltage. A single-ended type sense amplifier coupled with the common data line is basically constructed of a current mirror type sense circuit. Between the noninverting input node of the sense circuit coupled with the common data line and the inverting input node, there is disposed a shorting means for temporarily transmitting the level on the common data line after charge sharing is effected between the selected data line and the common data line.

By virtue of the described means, although a plurality of latch circuits, for storing information, are electrically connected with their corresponding data line through the first switch IGFET (MISFET or MOSFET) in an ON state at the time of a read operation, wasteful currents do not flow through unselected data lines.

Therefore, the number of signal lines required for each column of the memory array and also the number of IGFETs (MISFETs or MOSFETs) required for each memory cell can be reduced while the read current of the static RAM is greatly reduced. Further, it is made possible to realize a single-ended type sense amplifier suitable for use in the unitized data line system and capable of stabilized functioning and to thereby promote the unitization of the data line for static RAMs and the like. Thus, lowering of power consumption and reduction in the required layout area of the static RAM can be attained and, hence, lowering of power consumption and reduction in cost of large-scale logical integrated circuit devices and the like mounting the static RAM thereon can be attained.

DESCRIPTION OF THE PREFERRED EMBODIMENTS

Figure 1:
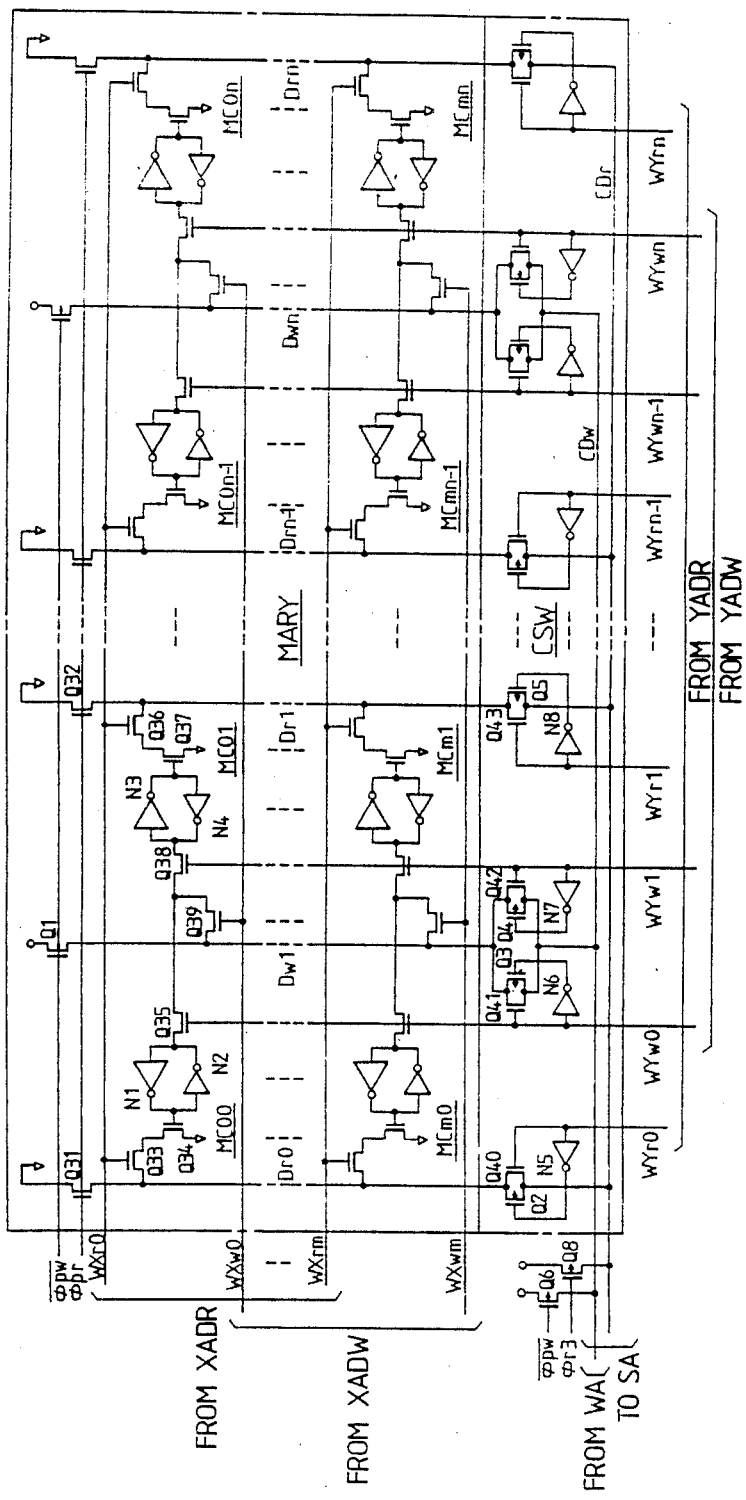
FIG. 1 is a circuit diagram showing an embodiment of a memory array for a static RAM (SRAM) and peripheral circuits to which the present invention is applied.
Figure 2:
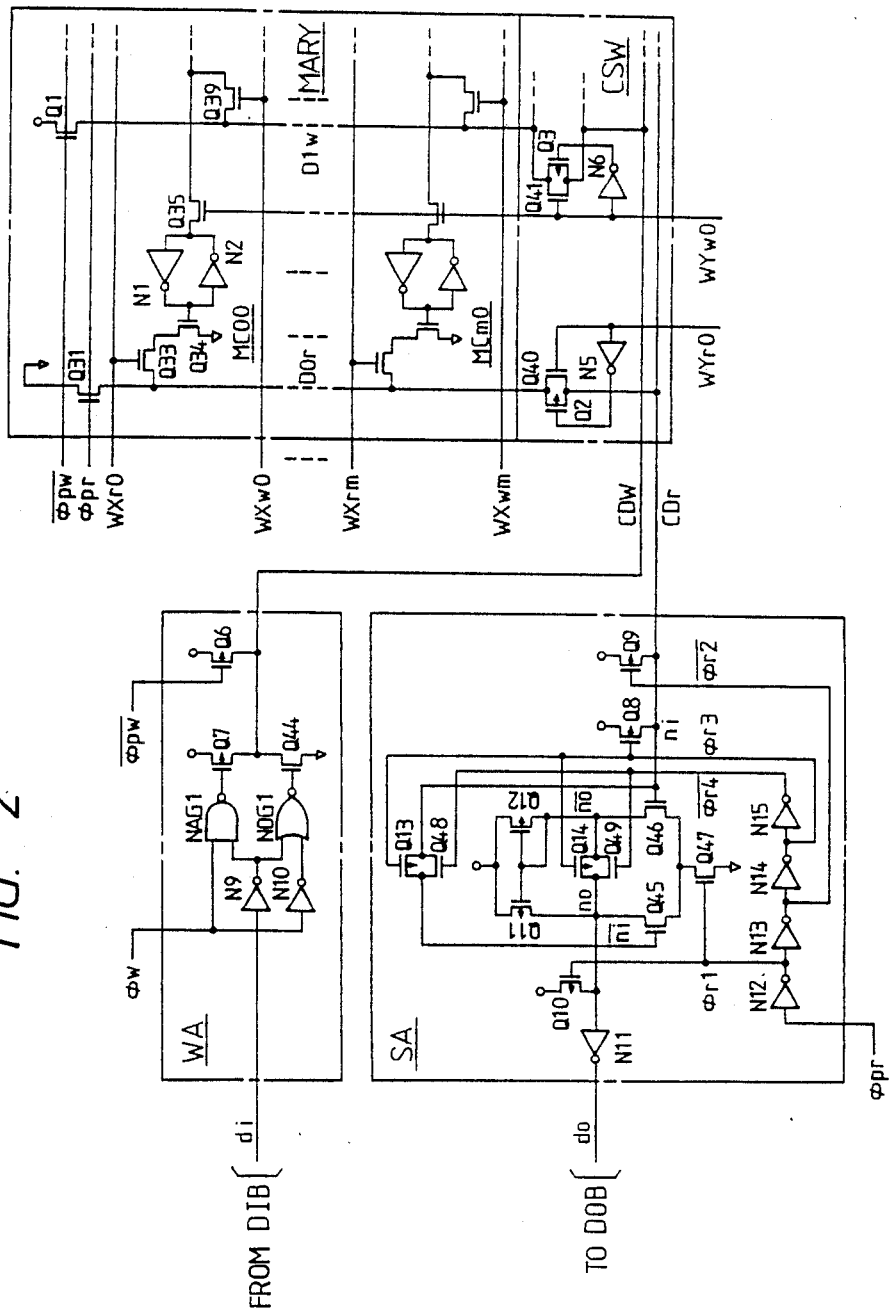
FIG. 2 is a circuit diagram showing an embodiment of a sense amplifier and a write amplifier for a static RAM to which the present invention is applied.
Figure 3:
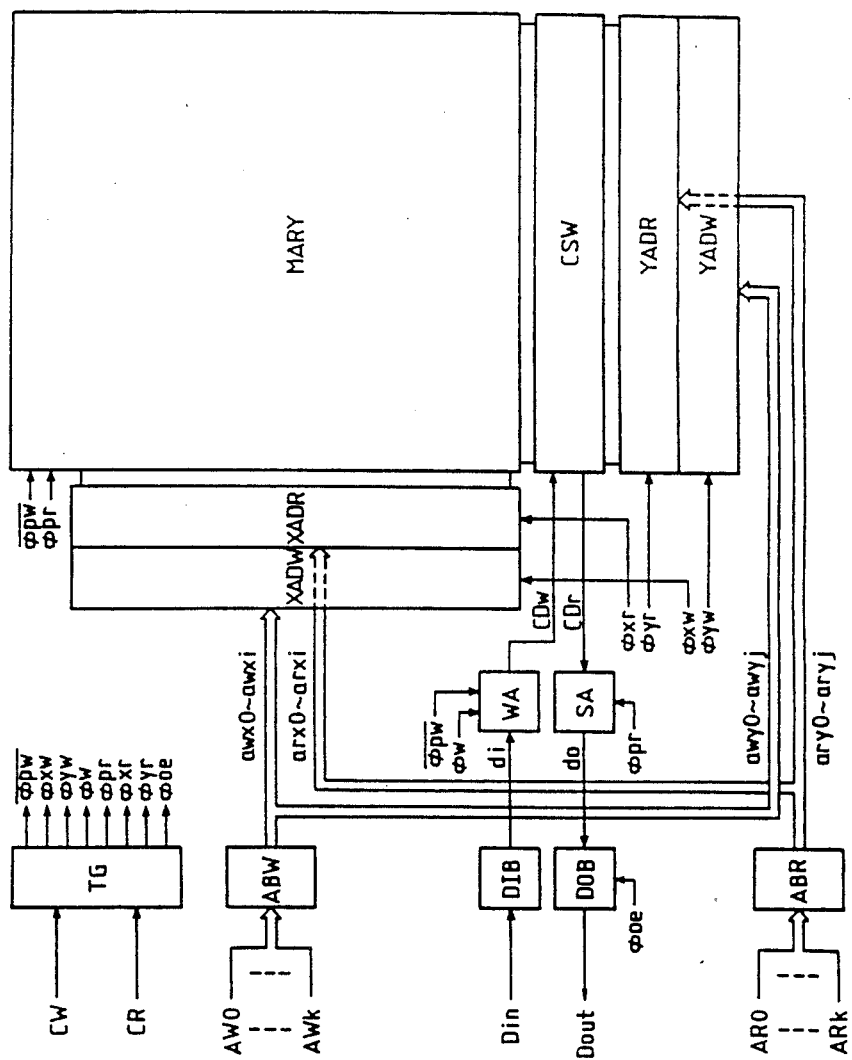
FIG. 3 is a block diagram showing an embodiment of a static RAM including the memory array of FIG. 1 and the sense amplifier and write amplifier of FIG. 2.
Figure 4:
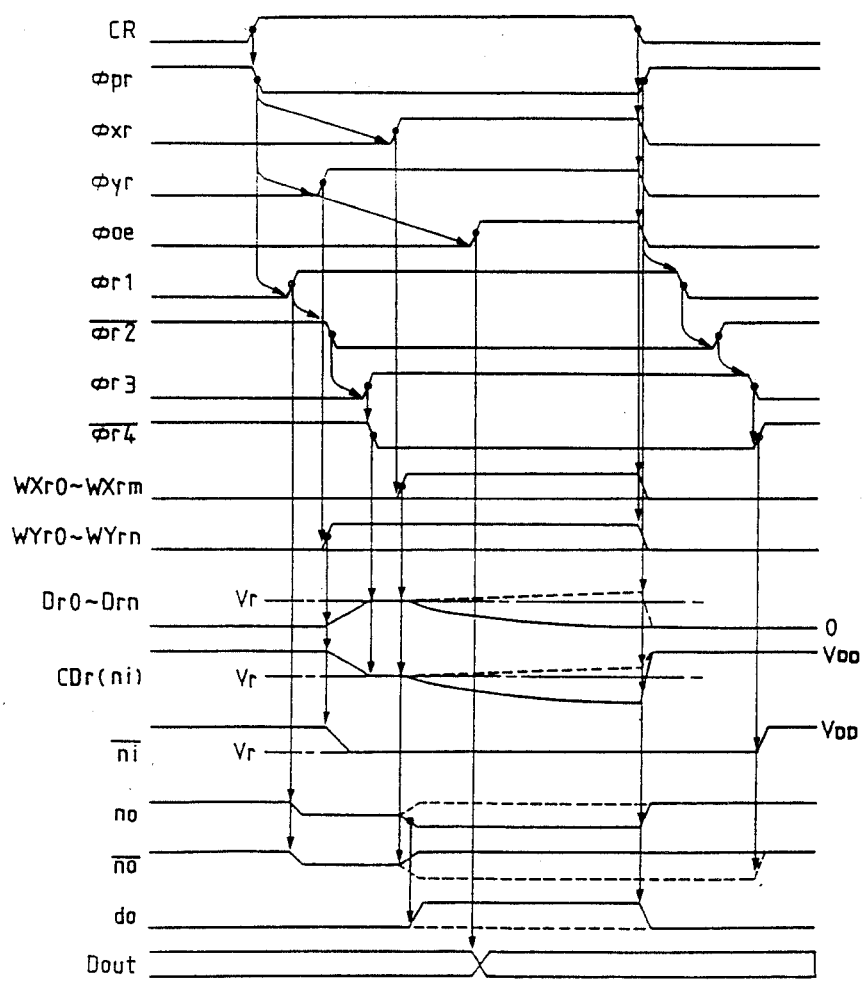
FIG. 4 is a timing chart related to an embodiment of a static RAM of a read operation of the static RAM of FIG. 3.

FIG. 3 shows a block diagram of an embodiment of a static RAM to which the present invention is applied. FIG. 1 shows a circuit diagram of the embodiment of a memory array MARY and column switches CSW of the static RAM of FIG. 3, and FIG. 2 shows a circuit diagram of the embodiment of a sense amplifier SA and a write amplifier WA. Further, FIG. 4 shows a timing chart related to the embodiment of a static RAM of FIG. 3 in connection with a read operation. In connection with the above-said drawings, a brief outline of and characteristics of the structure employed and a detailed description in connection with the operation of the static RAM of the present invention will also be described below. Although it is not to be considered as being limited thereto, the static RAM is mounted on a large scale logical integrated circuit device, for example, for a digital processing system. The circuit elements shown in FIG. 1 and FIG. 2 and circuit elements constituting the blocks shown in FIG. 3 are formed on a single semiconductor substrate such as a single crystalline silicon substrate together with other circuit elements, not shown, of the large scale logical integrated circuit device. In the following drawings, P-channel (second conduction type) IGFETs (MISFETs or MOSFETs) are indicated with an arrowhead attached to their channel (back gate) portion so as to be distinguished from N-channel (first conduction type) IGFETs (MISFETs or MOSFETs) which have no such arrowhead.

Referring to FIG. 3, a static RAM of the present embodiment is formed in a two-port RAM. The two access ports are exclusively used, respectively, as a write port and a read port. The write port is supplied with a write clock signal CW as a start control signal from a circuit in the preceding stage, not shown, of the logical integrated circuit device and, further, with input data Din and a (k+1)-bit write address signal AW0-AWk. Similarly, the read port is supplied with a read clock signal CR as a start control signal from the circuit in the preceding stage and, further, with a (k+1)-bit read address signal AR0-ARk. The read signal output from the read port is supplied as output data Dout to a circuit in the succeeding stage, not shown, of the logical integrated circuit device.

The static RAM is basically constructed of the memory array MARY, arranged to occupy most of the layout area thereof, and column switches CSW. It comprises, with respect to the write port, an address buffer for writing ABW, an X-address decoder for writing XADW, a Y-address decoder for writing YADW, a write amplifier WA and a data input buffer DIB. The static RAM further comprises, in connection with the read port, an address buffer for reading ABR, an X-address decoder for reading XADR, a Y-address decoder for reading YADR, a sense amplifier SA and a data output buffer DOB.

The memory array MARY, as shown in FIG. 1, includes (m+1) number each of X word lines for writing (first X word lines) WXw0-WXwm and X word lines for reading (second X word lines) WXr0-WXrm, which are arranged in parallel in the horizontal direction, and, further, (n+1)/2 number of data lines for writing (first data lines) Dw1-Dwn, (n+1) number each of data lines for reading (second data lines) Dr0-Drn, and Y word lines for writing (first Y word lines) WYw0-WYwn as well as Y word lines for reading (second Y word lines) WYr0-WYrn, which are arranged in parallel in the vertical direction. At intersections of the X word lines and the data lines as well as the Y word lines, there are arranged (m+1)×(n+1) number of static memory cells MC00-MC0n to MCm0-MCmn in a matrix array. The X word lines for writing WXw0-WXwm, Y word lines for writing WYw0-WYwn, and data lines for writing Dw1-Dwn correspond to the write port for the static RAM, whereas the X word lines for reading WXr0-WXrm, Y word lines for reading WYr0-WYrn and data lines for reading Dr0-Drn correspond to the read port for the static RAM. In the present embodiment, the data lines for writing and the data lines for reading are not arranged in the form of complementary data lines rather each thereof is unitized. As a result, the memory cells of the static RAM are simplified and the number of signal lines required for each column is reduced.

Each of the memory cells MC constituting the memory array MARY is basically constructed of a regeneratively connected latch circuit formed of a pair of CMOS inverter circuits N1 and N2, or N3 and N4, in a cross-coupling bistable arrangement, as representatively shown by the memory cell MC00 or MC01 in FIG. 1. In this embodiment, the node to which the input terminal of the inverter circuit N1 and the output terminal of the inverter circuit N2 are commonly coupled is exclusively used as the input node of this latch circuit. Similarly, the node to which the output terminal of the inverter circuit N1 and the input terminal of the inverter circuit N2 are commonly coupled is exclusively used as the output node of this latch circuit. Further, the inverter circuits N2 and N4 whose output terminals are coupled with the input node of each of the latches are designed to have smaller driving capacity (lower gain) than the other inverter circuits N1 and N3. As a result, the write path and the read path of the memory cell can be separated, the write current into the static RAM is reduced, and the write operation can be maintained stable.

The input node of each latch is coupled with a MOSFET Q35 or Q38, used for column selection control for writing, which in turn is coupled with its corresponding data line Dw1-Dwn for writing through a MOSFET Q39, used for row selection control for writing. The gates of the row selection control MOSFETs Q39 are commonly coupled with their corresponding X word lines WXw0-WXwm, whereas the gates of the column selection control MOSFETs Q35 and Q38, respectively, are commonly coupled with their corresponding Y word lines WYw0-WYwn. That is, in the memory array MARY of the present embodiment, the memory cell is alternatively selected at the write port, namely, the system is arranged in the so-called one-memory cell selection system. Further, it is arranged such that each data line for writing Dw1-Dwn is commonly owned by 5 memory cells in adjacent or in the adjoining two columns and the row selection control MOSFET Q39 is commonly owned by the two memory cells disposed in the adjoining columns. As a result, the memory cells of the static RAM are further simplified and thus the required number of the signal lines in the column direction can thus be reduced even more so.

On the other hand, the output node of each latch is coupled with the gate of a MOSFET for reading Q34 or Q37. The sources of the MOSFETs Q34 and Q37 are coupled with the ground potential of the circuit and the drains thereof are coupled with their respective data lines for reading Dr0-Drn (the second data lines) through row selection control MOSFET for reading Q33 or Q36. Namely, in the memory array MARY of the present embodiment, the output nodes of the latches are indirectly coupled with their respective data lines for reading Dr0-Drn through the gate of the MOSFET for reading Q34 or Q37. As a result, the data retained in a memory cell is prevented from being destroyed by a read operation, as will be described later, and, hence, restrictions as to the precharge level for the data line for reading and the common data line for reading can be removed.

The X word lines for writing WXw0-WXwm as the constituent of the memory array MARY are coupled with an X address decoder for writing XADW and thereby brought into a selected state alternatively. Likewise, the X word lines for reading WXr0-WXrm are coupled with an X address decoder for reading XADR and thereby brought into a selected state alternatively. The X address decoder for writing XADW is supplied with (i+1) bits of internal address signals awx0-awxi from the address buffer for writing ABW as shown in FIG. 3 in accordance with a timing signal $\theta xw$ from a timing generator TG. Likewise, the X address decoder for reading XADR is supplied with (i+1) bits of internal address signals arx0-arxi from the address buffer for reading ABR in accordance with a timing signal $\theta xr$ from the timing generator TG. Here, the timing signal $\theta xw$ is normally held at a low level and, when the write port is brought into a selected state in response to the write clock signal CW being brought to a high level, $\theta xw$ is similarly brought to a high level at a predetermined time. Likewise, the timing signal $\theta xr$ is normally held at a low level as shown in FIG. 4, but when the read port is brought into a selected state in response to the read clock signal CR being brought to a high level, $\theta xr$ is similarly brought to a high level at a predetermined time.

The X address decoder for writing XADW is selectively brought into an operational state in accordance with the timing signal $\theta xw$ becoming a high level. In such operational state, the X address decoder for writing XADW decodes the internal address signals awx0-awxi and alternatively brings the corresponding X word line for writing WXw0-WXwm into a selected state by setting it at a high level. Likewise, the X address decoder for reading XADR is selectively brought into an operational state in accordance with the timing signal $\theta xr$ becoming a high level In such operational state, the X address decoder for reading XADR decodes the internal address signals arx0-arxi and alternatively brings the corresponding X word line for reading WXr0-WXrm into a selected state by setting it at a high level.

The address buffer for writing ABW receives (k+1) bits of write address signals AW0-AWk supplied from the preceding circuit, not shown, of the logical integrated circuit device and retains the same. It, based on such write address signals, generates (i+1) bits of internal address signals awx0-awxi and (j+1) bits of internal address signals awy0-awyj. Of these address signals, the internal address signals awx0-awxi are supplied to the X address decoder for writing XADW as described above and the internal address signals awy0-awyj are supplied to Y address decoder for writing YADW which will be subsequently described. Likewise, the address buffer for reading ABR receives (k+1) bits of read address signals AR0-ARk supplied from the preceding circuit, not shown, of the logical integrated circuit device and retains the same. It, based on such read address signals, generates (i+1) bits of internal address signals arx0-arxi and (j+1) bits of internal address signals ary0-aryj. Of these address signals, the internal address signals arx0-arxi are supplied to the X address decoder for reading XADR as described above and the internal address signals ary0-aryj are supplied to Y address decoder for reading YADR which will be subsequently described.

Meanwhile, the Y word lines for writing WYw0-WYwn which correspond to the memory array MARY are coupled with the Y address decoder for writing YADW through the column switches CSW as shown in FIG. 1 and alternatively brought into a selected state. The Y address decoder for writing YADW is supplied with the (j+1)-bit internal address signals awy0-awyj from the address buffer for writing ABR and with a timing signal $\theta yw$ from the timing generator TG, as shown in FIG. 3 Here, the timing signal $\theta yw$ is normally held at a low level and, when the write port is brought into a selected state upon the write clock signal CW being brought to a high level, $\theta yw$ is also brought to a high level at a predetermined time.

The Y address decoder for writing YADW is selectively brought into an operational state in accordance with a high level of the timing signal $\theta yw$. In such operational state, the Y address decoder for writing YADW decodes the internal address signals awy0-awyj and alternatively brings the corresponding Y word line for writing WYw0-WYwn into a selected state by setting it at a high level.

Then, the constituent data lines for writing Dw1-Dwn of the memory array MARY are, on the one hand, respectively coupled, at one end thereof, with the power-source voltage of the circuit through their corresponding P-channel type precharge MOSFETs Q1 and, on the other hand, selectively coupled, at the opposite end thereof, with a common data line for writing CDw through their corresponding complementary IGFET (MISFET or MOSFET) switches Q3–Q41 or Q4–Q42 (first switch means) of the column switch CSW. Here, the power-source voltage of the circuit is set, though not limited thereto, to a positive voltage as +5 V.

The gates of the precharge MOSFETs Q1 are coupled together and supplied with an inverted timing signal $\overline{\theta pw}$ from the timing generator TG. Here, the inverted timing signal $\overline{\theta pw}$ is, though not limited thereto, held at a low level when the write port is in a nonselected state and becomes a high level when the write port is placed at a selected state.

The precharge MOSFETs Q1 are selectively brought into an ON state when the write port is placed at a nonselected state since the inverted timing signal $\overline{\theta pw}$ is brought to a low level whereupon their corresponding data lines for writing Dw1-Dwn become precharged to a high level corresponding to the power-source voltage of the circuit. When the write port is placed at a selected state and the inverted timing signal $\theta$pw is brought to a high level, these precharge MOSFETs Q1 are brought into an OFF state.

Likewise, the constituent data lines for reading DR0-Drn of the memory array MARY are, on the one hand, respectively coupled, at one end thereof, with the ground potential of the circuit through their corresponding N-channel type precharge MOSFETs Q31 or Q32 and, on the other hand, are selectively coupled at an opposite end thereof with a common data line for reading CDr through their corresponding complementary IGFET (MISFET or MOSFET) switch Q2-Q40 or Q5-Q43 of the column switches CSW.

The gates of the precharge MOSFETs Q31 and Q32 are coupled together and supplied with a timing signal $\theta$pr from the timing generator TG. Here, the timing signal $\theta$pr is, as shown in FIG. 4, brought to a high level when the read port is placed at a nonselected state and, when the read port is placed at a selected state, $\theta$pr is brought to a low level at a predetermined time.

The precharge MOSFETs Q31 and Q32 are selectively brought into an ON state in response to a high level of the timing signal $\theta$pr when the read port is placed at a nonselected state. As a result, their corresponding data lines for reading Dr0-Drn become precharged to a low level corresponding to the ground potential of the circuit as shown in FIG. 4. When the read port is placed at a selected state and the timing signal $\theta$pr is brought to a low level, the corresponding precharge MOSFETs Q31 and Q32 are brought into an OFF state.

The column switches CSW include (n+1)/2 sets of complementary MOSFET switches Q3-Q41 and Q4-Q42 provided so as to correspond to the number of constituent data lines for writing Dw1-Dwn of the memory array MARY. Similarly, (n+1) sets of complementary MOSFET switches Q2-Q40 or Q5-Q43 provided corresponding to the data lines for reading Dr0-Drn. The complementary MOSFET switches Q3-Q41 and Q4-Q42 are coupled together for each set in an arrangement wherein the junctions on one side thereof are coupled with their corresponding data lines for writing Dw1-Dwn of the memory array MARY and the junctions on the other side thereof are commonly coupled with the common data line for writing CDw. In each set thereof, the gates of the MOSFETs Q41 and Q42 are respectively coupled with their corresponding Y word lines for writing WYw0-WYwn, e.g., of adjacent columns, whereas the gates of the MOSFETs Q3 and Q4 are coupled with their corresponding Y word lines for writing WYw0-WYwn through corresponding inverter circuits N6 and N7. As a result, the data lines for writing Dw1 to Dwn are selectively connected to the common data line for writing CDw in accordance with their corresponding Y word line for writing WYw0 or WYw1 to WYwn-1 or WYwn becoming a high level.

Now, with the write port of the present invention, since the input node of a memory cell is alternatively selected, the above described column switches CSW are not required as far as the selecting operation is concerned. However, if all the data lines for writing are connected with the common data line for writing at all times, the load on the write amplifier WA becomes very great requiring a considerable driving capacity of the write amplifier WA. Therefore, in this embodiment, the switch MOSFETs for writing, as described above, are provided such that the data line for writing is selectively connected with the common data line for writing and thereby lowering the load on the write amplifier WA and reducing the required driving capacity thereof.

On the other hand, the complementary MOSFET switches (CMOS transmission gates) Q2-Q40 and Q5-Q43 are coupled at one side thereof with their corresponding data line for reading Dr0-Drn of the memory array MARY and commonly coupled at the other side thereof with the common data line for reading CDr. The gates of the MOSFETs Q40 and Q43 are coupled with their corresponding Y word lines for reading WYr0-WYrn, whereas the gates of the MOSFETs Q2 and Q5 are coupled with their corresponding Y word lines for reading WYr0-WYrn through corresponding inverter circuits N5 and N8. These Y word lines for reading WYr0-WYrn are coupled with the Y address decoder for reading YADR and are thereby alternatively brought into a selected state when they are set at a high level. As a result, the data lines for reading Dr0-Drn are selectively connected with the common data line CDr for reading on condition that the corresponding Y word line for reading WYr0-WYrn is alternatively brought to a high level.

The Y address decoder for reading YADR is supplied with (j+1) bits of internal address signals ary1-aryj from the address buffer for reading ABR and with a timing signal $\theta$yr from the timing generator TG, as shown in FIG. 3. Here, as shown in FIG. 4, the timing signal $\theta$yr is normally held at a low level and, when the read port is placed at a selected state in response to the reading clock signal CR becoming a high level, $\theta$yr is brought to a high level prior to the timing signal $\theta$xr becoming a high level.

The Y address decoder for reading YADR is selectively brought into an operational state in accordance with the timing signal $\theta$yr becoming a high level. In this operational state, the Y address decoder for reading YADR decodes the internal address signals ary0-aryj and alternatively places the corresponding Y word line for reading WYr0-WYrn at a selected state when it is set at a high level.

In the static RAM according to the present embodiment, the data lines for reading Dr0-Drn are precharged to a low level, corresponding to the ground level of the circuit, when the read port is brought into a nonselected state, as described above. The common data line for reading CDr is precharged to a high level, corresponding to the power-source voltage of the circuit, through a P-channel type precharge MOSFET Q8 when the read port is placed at a nonselected state, as will be described. Further, the Y word line for reading WYr0-WYrn is, alternatively, brought into a selected state when it is set at a high level preceding the corresponding X word line selection for reading WXr0-WXrm as shown in FIG. 4.

Hence, one of the Y word lines for reading WYr0-WYrn is first set at a high level and, thereby, its corresponding data line for reading Dr0-Drn and the common data line for reading CDr are selectively connected. Thereupon, charge sharing is effected according to their respective parasitic capacitance. As a result, the level of the connected data line for reading and the common data line for reading settles or stabilizes at a predetermined level Vr, as shown in FIG. 4. Then, one of the X word lines for reading WXr0-WXrm is raised to a high level and, thereby, the output node of the corresponding memory cell is coupled with the aforesaid selected data line for reading and, thereupon, a read current in accordance with the stored data is permitted to flow. More particularly, if the stored data in the selected memory cell is a logical 1, the output node of the corresponding latch is brought to a high level, whereby the MOSFET Q34 or Q37 for reading is brought into an ON state. Hence, the levels of the corresponding data line for reading Dr0-Drn and the common data line for reading CDr are progressively lowered as indicated by solid lines in FIG. 4 wherein they finally reach the low level which corresponds to the ground level of the circuit. If, on the other hand, the data stored in the selected memory cell is a logical 0, the output node of the corresponding latch is brought to a low level, whereby the MOSFET Q34 or Q37 for reading remains in the OFF state. Hence, the levels of the corresponding data line for reading Dr0-Drn and the common data line for reading CDr remain at or tend to maintain the level Vr after the aforesaid charge sharing.

In the present embodiment, as will be described later, there is a MOSFET Q9, having relatively low conductance and being adapted so that it will remain in an ON state while the sense amplifier SA is in its operational state, disposed between the common data line for reading CDr and the power-source voltage of the circuit. Hence when the stored data in a selected memory cell is a logical 0, the levels of the corresponding data line for reading Dr0-Drn and the common data line for reading CDr are progressively pushed up as indicated by dotted lines in FIG. 4. As a result, the reading operations in the static RAM can be stabilized regardless of the stored data in the selected memory cell, to be described later.

In the memory array MARY of the present embodiment, when the X word line for reading WXr0-WXrm is selected all the output nodes of (n+1) memory cells which are coupled with that X word line for reading become simultaneously coupled with the corresponding data lines for reading Dr0-Drn. As to these data lines for reading, the one thereof corresponding to the complementary MOSFET switches Q2-Q40 or Q5-Q43 of the column switch CSW which is in an ON state and which data line is thereby coupled with the common data line for reading CDr, as described above, corresponds to the one having a precharge level which is held high by charge sharing. Hence, a read current in accordance with the stored data in the selected memory cell is permitted to flow. However, with respect to the other data lines for reading that have not been selected, since their levels are held low as a result of an earlier precharging thereof, the read current does not flow through any of them even if the reading MOSFET Q34 or Q37 of the memory cell is brought to an ON state. In other words, in the memory array MARY of the present embodiment, the selection of a row at the read port is performed for the word line as one unit, namely, the so-called common selection system is adopted. However, the current is permitted to flow only through the data line connected with the selectively designated one memory cell. Therefore, in substance, power consumption can be kept as low as in a single memory cell selection system. As a result, combined with the fact that the write port is arranged to be a single selection system as previously described, the power consumption in the static RAM can be greatly reduced.

In FIG. 3, the common data line for writing CDw is coupled with the output terminal of the write amplifier WA and the common data line for reading CDr is coupled with the input terminal of the sense amplifier SA. The input terminal of the write amplifier WA is coupled with the output terminal of the data input buffer DIB, while the output terminal of the sense amplifier SA is coupled with the input terminal of the data output buffer DOB. The input terminal of the data input buffer DIB is supplied with input data Din from the circuit, not shown, in the preceding stage of the logical integrated circuit device and the output signal of the data output buffer DOB is supplied as the output data Dout to the circuit, not shown, in the succeeding stage of the logical integrated circuit device. The write amplifier WA is supplied with a timing signal $\theta w$ and the earlier described inverted timing signal $\overline{\theta pw}$ from the timing generator TG, whereas the sense amplifier SA is supplied with the earlier described timing signal $\theta pr$. The data output buffer DOB is supplied with a timing signal $\theta oe$. Here, the timing signal $\theta w$ is normally held at a low level and when the write port is placed at a selected state, $\theta w$ is changed to a high level at predetermined timing and remains at the high level temporarily. The timing signal $\theta oe$ is normally held at a low level as shown in FIG. 4 and, when the read port is placed at a selected state, $\theta oe$ is changed to a high level following the corresponding transitions of the other timing signals.

The data input buffer DIB, when the write port of the static RAM is brought into a selected state, takes the input data Din supplied from the preceding circuit, not shown, and retains it. It further generates internal input data di based on the input data Din and supplies it to the write amplifier WA.

The write amplifier WA, as shown in FIG. 2, is basically constructed of two output MOSFETs Q7 and Q44 disposed in a series arrangement between the power-source voltage and ground potential of the circuit. The drains of the MOSFETs Q7 and Q4 are coupled together and the junction thereof is coupled with the common data line for writing CDw and is also coupled with the power-source voltage of the circuit through a precharge MOSFET Q6. The gate of the precharge MOSFET Q6 is supplied with the inverted timing signal $\overline{\theta pw}$.

The gate of the output MOSFET Q7 (pull-up MOSFET) of the write amplifier WA is coupled with the output terminal of a NAND gate circuit NAG1 and the gate of the output MOSFET Q44 (pull-down MOSFET) is coupled with the output terminal of a NOR gate circuit NOG1. One input terminal of the NAND gate circuit NAG1 is supplied with the timing signal $\theta w$ and one input terminal of the NOR gate circuit NOG1 is supplied with an inverted signal of the timing signal $\theta w$ by an inverter circuit N10. The other input terminals of the NAND gate circuit NAG1 and the NOR gate circuit NOG1 are commonly supplied with an inverted signal of the internal input data di by an inverter circuit N9.

When the write port of the static RAM is brought into a nonselected state, both the inverted timing signal $\overline{\theta pw}$ and the timing signal $\theta w$ are brought to a low level. Thus, the output signal of the NAND gate circuit NAG1 is fixed to a high level regardless of the internal input data di and the output signal of the NOR gate circuit NOG1 is fixed to a low level regardless of the internal input data di. Hence, the output MOSFETs Q7 and Q44 are both brought into an OFF state. Then, upon going to a low level of the inverted timing signal $\overline{\theta pw}$, the precharge MOSFET Q6 is brought into an ON state, whereby the common data line for writing CDw is precharged to a high level corresponding to the power-source voltage of the circuit.

When the write port of the static RAM is placed at a selected state, first the inverted timing signal $\overline{\theta pw}$ is brought to a high level and then the timing signal $\theta w$ is brought to a high level at a predetermined timing and is temporarily held at a high level. In the write amplifier WA, when the inverted timing signal $\overline{\theta pw}$ is set at a high level, the precharge MOSFET Q6 is brought to an OFF state, whereby the precharging operation for the common data line for writing CDw is stopped. Further, when the timing signal $\theta w$ is set at a high level, the output MOSFET Q7 or Q44 is complementarily brought to an ON state in accordance with the internal input data di and, thereby, the common data line for writing CDw is selectively brought to a low level or high level.

More particularly, when the input data Din is set to a logical 1 and the internal input data di is brought to a high level, the output signal of the NOR gate circuit NOG1 is brought to a high level in the write amplifier WA at the point of time when the timing signal $\theta w$ has reached a high level. Hence, the output MOSFET Q44 is brought to an ON state so that the common data line for writing CDw is brought to a low level which corresponds to the ground level of the circuit. The low level on the common data line for writing CDw is, as described above, transmitted to the selected memory cell through the column switch CSW and its corresponding data line for writing Dw1-Dwn. As a result, the input node of the corresponding latch is brought to a low level and the output node is brought to a high level. At this time, of the inverter circuits forming the latch of the selected memory cell, the inverter circuit N2 whose output terminal is coupled with the input node of the latch thereof is designed to have smaller driving capacity and thus a lower gain than the other inverter circuit N1 of the latch. Therefore, in the static RAM of the present invention, the operating current required for writing into the memory cell is reduced and, at the same time, the writing operation is stabilized.

On the other hand, when the input data Din is set to a logical 0 and the internal input data di is brought to a low level, the output signal of the NAND gate circuit NAG1 is brought to a low level in the write amplifier WA at the point of time when the timing signal $\theta w$ has reached a high level. Hence, the output MOSFET Q7 is brought to an ON state so that the common data line for writing CDw is brought to a high level which corresponds to the power-source voltage of the circuit. The high level on the common data line for writing CDw is, similarly, transmitted to the selected memory cell through the column switch CSW and its corresponding data line for writing Dw1-Dwn. As a result, the input node of the corresponding latch is brought to a high level and the output node thereof is brought to a low level.

The sense amplifier SA is basically constructed of a sense circuit (differential amplifier circuit) including a pair of MOSFETS Q46 and Q45 arranged in a differential configuration as shown in FIG. 2. Between the drains of the MOSFETs Q46 and Q45 and the power-source voltage of the circuit, there are disposed MOSFETS Q12 and Q11, respectively. The gate of the MOSFET Q12 is coupled with its drain and is also coupled with the gate of the MOSFET Q11. Thus, the MOSFETs Q12 and Q11 are arranged in a current mirror configuration. The sources of the MOSFETs Q46 and Q45 are commonly coupled and are, furthermore, coupled to the ground potential of the circuit through a driving MOSFET Q47. The gate of the driving MOSFET Q47 is supplied with a timing signal $\theta r1$, which is an inverted and delayed signal of the aforesaid timing signal $\theta pr$ through an inverted circuit N12.

The gate of the MOSFET Q46 is coupled as a noninverting input node ni of the sense circuit with the common data line for reading CDr and is further coupled to receive the power-source voltage of the circuit through the MOSFETs Q8 and Q9. The gate of the MOSFET Q9 is supplied with an inverted timing signal $\overline{\theta r2}$, which is a delayed signal of the timing signal $\theta pr$ through inverter circuits N12 and N13, whereas the gate of the MOSFET Q8 is supplied with a timing signal $\theta r3$, which is an inverted and delayed signal of the aforesaid inverted timing signal $\overline{\theta r2}$ through a further inverter circuit N14. In the present embodiment, the MOSFET Q9 is designed to have a relatively small value of conductance.

The sense amplifier SA further includes a complementary MOSFET switch Q13-Q48 disposed between the noninverting input mode ni of the sense circuit and the gate of the MOSFET Q45, i.e., an inverting input node $\overline{ni}$ of the sense circuit. The gate of the MOSFET Q13 is supplied with the timing signal $\theta r3$, whereas the gate of the MOSFET Q48 is supplied with an inverted signal of the timing signal $\theta r3$ through an inverter circuit N15, i.e., an inverted timing signal $\overline{\theta r4}$. In the present embodiment, the aforesaid timing signals $\theta ri$ and $\theta r3$, as well as the inverted timing signals $\overline{\theta r2}$ and $\overline{\theta r4}$ have temporal relationships as shown in FIG. 4. More particularly, the timing signal $\theta r1$ is obtained by having the timing signal $\theta pr$ slightly delayed and inverted and the inverted timing signal $\overline{\theta r2}$ is obtained by having the aforesaid timing signal $\theta r1$ slightly delayed and inverted. Further, the timing signal $\theta r3$ is obtained by having the aforesaid inverted timing signal $\overline{\theta r2}$ slightly delayed and inverted and the inverted timing signal $\overline{\theta r4}$ is obtained by having the aforesaid timing signal $\theta r3$ inverted but substantially not delayed. The complementary MOSFET switch Q13-Q48, when the timing signal $\theta r3$ is brought to a low level and the inverted timing signal $\overline{\theta r4}$ is brought to a high level, are brought to an ON state virtually at the same time, and thereby the noninverting input node ni and the inverting input node $\overline{ni}$ of the sense circuit become shorted.

The drains of the MOSFET Q45 and Q11 are coupled together and the junction thereof is coupled with the input terminal of an output inverter circuit N11 as a noninverting output node no of the sense circuit and, further, is coupled to receive the power-source voltage of the circuit through a preset MOSFET Q10. The gate of the MOSFET Q10 is supplied with the timing signal $\theta r1$. The output signal of the output inverter circuit N11 is supplied to the data output buffer DOB as the output signal of the sense amplifier SA, i.e., internal output data do.

The sense amplifier SA of the present embodiment further includes a complementary MOSFET switch Q14-Q49 disposed between the noninverting and inverting output nodes no and $\overline{no}$, respectively, of the sense circuit, the noninverting node corresponding to the junction of the commonly coupled drains of the MOSFETs Q46 and Q12. The gate of the MOSFET Q14 is supplied with the timing signal $\theta r3$ and the gate of the MOSFET Q49 is supplied with the inverted timing signal $\overline{\theta r4}$. Hence, when the timing signal $\theta r3$ is brought to the low level and the inverted timing signal $\overline{\theta r4}$ is brought to the high level, the complementary MOSFET switch Q14–Q49 is brought to an ON state simultaneously with the aforesaid complementary MOSFET switch Q13–Q48, whereby the noninverting output node no and the inverting output node $\overline{no}$ of the sense circuit are shorted.

When the read port of the static RAM is placed or set at a nonselected state and the timing signal $\theta pr$ is brought to a high level, the timing signals $\theta r1$ and $\theta r3$ are brought to a low level and the inverted timing signals $\overline{\theta r2}$ and $\overline{\theta r4}$ are brought to a high level as shown in FIG. 4. Hence, in the sense amplifier SA, the precharge MOSFET Q8 and the preset MOSFET Q10 are brought to ON states and the MOSFET Q9 and the drive MOSFET Q47 are brought into OFF states. Further, the complementary MOSFET switches Q13–Q48 and Q14–Q49 are both brought into ON states, whereby the noninverting input node ni and the inverting input node $\overline{ni}$, as well as the noninverting output node no and the inverting output node $\overline{no}$, of the sense circuit are shorted. Hence, the sense circuit is brought into a nonoperational state and its noninverting input node ni, i.e., the common data line for reading CDr, and the noninverting output node no are precharged to a high level which corresponds to the power-source voltage of the circuit. Such a high level is transmitted also to the inverting input node $\overline{ni}$ and the inverting output node $\overline{no}$ of the sense circuit through the complementary MOSFET switches Q13–Q48 and Q14–Q49. The output signal of the sense amplifier SA, i.e., the internal output data do, is brought to a low level in response to a high level at the noninverting output node no of the sense circuit.

When the read port of the static RAM is placed at a selected state and the precharge timing signal $\theta pr$ associated therewith is brought to a low level, first, after a slight delay, the timing signal $\theta r1$, associated with the sense amplifier SA, is brought to a high level as shown in FIG. 4. Subsequently, after an additional brief delay, the inverted timing signal $\overline{\theta r2}$ is brought to a low level. Further, a short period later, the timing signal $\theta r3$ is brought to a high level and then, virtually simultaneously, the inverted timing signal $\overline{\theta r4}$ is brought to a low level. Here, the timing at which the timing signal $\theta r1$ is changed to a high level corresponds to that point in time immediately before the selecting operation of the data line for reading, i.e., the selecting operation of a column, is started by the column switch, whereas the period of time between the going high of the timing signal $\theta r3$ and the going low of the inverted timing signal $\overline{\theta r4}$ corresponds to that from the end of the aforesaid selecting operation of the data line for reading to the start of the row selecting operation through an X word line for reading.

In the sense amplifier SA, first the MOSFET Q10 is brought to an OFF state upon going high of the timing signal $\theta r1$ and the driving MOSFET Q47 is brought to an ON state. Hence, while the presetting operation of the noninverting output node no is stopped, the sense circuit is brought into an operational state with its noninverting output node no and inverting output node $\overline{no}$ shorted. Therefore, the noninverting output node no and the inverting output node $\overline{no}$ of the sense circuit have their corresponding potentials lowered virtually to an equalized central level. Thus, the offset by the provision of the preset MOSFET Q10 is eliminated and the levels of the noninverting output node no and the inverting output node $\overline{no}$ immediately before starting their operations are made about equal. As a result, the sense circuit of the present embodiment can be made more stabilized in its operation than the prior art sense circuit having no complementary switch MOSFETs Q14–Q49 and can accordingly achieve a more speedy reading operation of the static RAM.

Then, in the sense amplifier SA, the MOSFET Q9 is brought to an ON state in response to the inverted timing signal $\overline{\theta r2}$ becoming a low level. As described before, this MOSFET Q9 is designed to have a relatively small value of conductance and is adapted to be continuously held ON while the sense circuit is in its operating state. Hence, the MOSFET Q9, when the stored data in the selected memory cell is a logical 0, progressively raises the level of the common data line for reading CDr as indicated by a dotted line in FIG. 4, whereby the operation of the sense circuit is stabilized.

Now, in the memory array MARY and the column switch CSW, before the timing signal $\theta r3$ is brought to a high level and the inverted timing signal $\overline{\theta r4}$ is brought to a low level, the selecting operation of the data line for reading Dr0-Drn through the Y word line for reading WYr0-WYrn is started, whereby one designated data line for reading and the common data line for reading CDr become connected, i.e. they are placed in a connected state. Then, the level of the selected data line for reading is elevated and the level of the common data line for reading CDr is lowered by virtue of the charge sharing, as described before, so that the potential levels thereat reach a predetermined level. Here, the level Vs after the charge sharing is expressed as $Vs = Vcc \times Cc/Cc + Cd,$ where Vcc represents the power-source voltage of the circuit and Cd and Cc represent values of parasitic capacitance of the selected data line for reading and the common data line for reading CDr. In a normal static RAM, the parasitic capacitance Cd of the data line for reading is, for example, four times as large as the parasitic capacitance Cc of the common data line for reading. Hence, the level Vs after the charge sharing will, when the power-source voltage Vcc of the circuit is +5 V, become as low as approximately +1 V, which does not serve as a bias voltage sufficient to operate the differential amplifier circuit of the sense amplifier SA efficiently. Therefore, in the sense amplifier SA of the present embodiment, the MOSFET Q8 is adapted to be maintained in an ON state during the period from the start of the selecting operation of the data line for reading or, in other words, the start of the charge sharing between the selected data line for reading and the common data line for reading CDr, to the recovery of the noninverting input node ni and the inverting input node $\overline{ni}$ of the sense circuit from the shorting caused therebetween by the complementary MOSFET switch Q13–Q48. As a result, the levels of the selected data line for reading and the common data line for reading CDr are pushed up to such a predetermined level Vr (a first level) as that corresponding to about half the power-source voltage Vcc of the circuit. The predetermined level Vr adapted is such that the most efficient bias voltage (reference potential) is applied to the sense circuit of the sense amplifier SA.

When the timing signal $\theta r3$ is changed to a high level and the inverted timing signal $\overline{\theta r4}$ is correspondingly changed to a low level, the complementary MOSFET switches Q13–Q48 and Q14–Q49 are brought to an OFF state in the sense amplifier SA and, thereby, the noninverting input node ni and inverting input node $\overline{\text{ni}}$, as well as the noninverting output node no and inverting output node $\overline{\text{no}}$, of the sense circuit are permitted to recover from the shorting state. Further, the aforesaid precharge MOSFET Q8 is brought into an OFF state and the precharging operation of the common data line for reading CDr is stopped. Thereby, the sense circuit is brought to a state substantially capable of amplification and ready for transmission of the read signal of the memory cell to the common data line for reading CDr. Meanwhile, until the complementary MOSFET switch Q13–Q48 is again brought into an ON state, the inverting input node $\overline{\text{ni}}$ of the sense circuit is maintained at the aforesaid potential Vr, which is used as the reference potential for performing the amplification of the read signal.

When the X word line for reading WXr0-WXrm of the memory array MARY is alternatively brought to a high level and a row is thereby selected, the read signal out of the selected memory cell is transmitted to the sense amplifier SA through the data line for reading which has already been selected and the common data line for reading CDr. As described above, when the stored data in the selected memory cell is a logical 1, the potential is progressively lowered from the level Vr so as to finally reach such a low level as that corresponding to the ground level of the circuit as shown by the solid line in FIG. 4, whereas when the stored data in the selected memory cell is a logical 0, the level Vr is attempted to be maintained.

In the static RAM of the present embodiment, however, there is provided a MOSFET Q9 having a relatively low conductance value disposed between the common data line for reading CDr and the power-source voltage of the circuit, and it is continuously held ON while the sense circuit is in its operating state. Thus, by the supply of the power-source voltage of the circuit through the MOSFET Q9, the level of the common data line for reading CDr, i.e., the aforesaid read signal, is progressively pushed up as shown by the dotted line in FIG. 4. As a result, there is produced a difference in level between the level of the noninverting input node ni of the sense circuit, i.e., the read signal, and the level of the inverting input node $\overline{\text{ni}}$, i.e., the reference level Vr, according to the stored data in the selected memory cell, and this difference in level is amplified by the sense circuit.

Thus, the potential of the noninverting output node no of the sense circuit which has been held at the intermediate level is rapidly changed in accordance with the stored data in the selected memory cell. More particularly, when the stored data in the selected memory cell is a logical 1, the noninverting output node no of the sense circuit is rapidly brought to such a low level as that of about the ground level of the circuit as indicated by the solid line in FIG. 4 and, thereby, the output signal of the inverter circuit N11, i.e., the internal output data do is brought to a high level. On the other hand, when the stored data in the selected memory is a logical 0, the potential of the noninverting output node no of the sense circuit is rapidly brought to such a high level as that of about the power-source voltage of the circuit as indicated by the dotted line in FIG. 4 so that the internal output data remains at a low level.

The output signal of the sense amplifier SA, i.e., the internal output data do, is delivered through the data output buffer DOB in accordance with a high level of the timing signal $\theta$oe as will be described later and transmitted as the output data Dout to the circuit, not shown, in the succeeding stage of the logical integrated circuit device.

The data output buffer DOB is selectively brought into an operational state in accordance with the timing signal $\theta$oe being set at a high level. In this operational state, the data output buffer DOB generates the output data Dout based on the internal output data do supplied from the sense amplifier SA and supplies the same to the circuit, not shown, in the succeeding stage of the logical integrated circuit device.

The timing generator TG generates the above described various timing signals in response to a write clock signal CW and a read clock signal CR supplied from a circuit, not shown, in the preceding stage of the logical integrated circuit device and accordingly supplies them to various circuits of the static RAM.

As described above, the static RAM of the present embodiment is mounted on a large-scale logical integrated circuit device and is arranged to operate as a two-port RAM having two access ports exclusively used as the read port and the write port. The static RAM of the present embodiment has features concerning the structure, method of selection, and the like of the memory array MARY and the sense amplifier SA such as follows:

(1) The data line for writing corresponding to the write port and the data line for reading corresponding to the read port are each unitized. Therefore, the number of required signal lines for each column of the static RAM can be reduced and the number of MOSFETs for each memory cell can be reduced.

(2) Each of the memory cells constituting the memory array is basically constructed of a latch with two CMOS inverter circuits arranged in a cross connection (bistable connection arrangement). A pair of the input and output nodes of the latch are exclusively used corresponding to their respective ports as the input node and the output node. Further, of the two inverter circuits constructing the latch, the driving capacity of one inverter circuit whose output terminal is coupled with the aforesaid input node is made smaller, i.e. has a lower gain, than that of the other inverter circuit. Thereby, the current for writing into the static RAM can be reduced and the write operation can be maintained stable.

(3) The input node of the latch is coupled with the data line for writing through the MOSFET for row selection control for writing and the MOSFET for column selection control for writing, and the output node of the latch is indirectly coupled with the data line for reading through the gate of the reading MOSFET which is coupled in a series arrangement with the MOSFET for row selection control for reading between the data line for reading and the ground potential of the circuit. Thus, the stored data in the memory cell is prevented from being destroyed through a reading operation, and therefore, restrictions as to the precharge level for the data line for reading and the common data line for reading or the like can be removed.

(4) The data line for writing is commonly owned by, i.e. it is common to, the memory cells in the adjacent two columns and the MOSFET for row selection control for writing is correspondingly commonly owned by the two memory cells disposed in the adjoining columns. Therefore, the number of required signal lines for each of the columns of the static RAM and the number of the MOSFETs for each memory cell thereof can further be decreased.

(5) When the read port is placed at a nonselected state, the data line for reading is precharged to the ground potential of the circuit and the common data line for reading is precharged to the power-source voltage of the circuit. When the read port is placed at a selected state, however, data line for reading is selectively connected with the common data line for reading through the column switch for column selection, and at this time, charge sharing is effected between the selected data line for reading and the common data line for reading depending on their parasitic capacitance values. Other data lines for reading not selected for their respective columns remain at the precharge level, i.e., the ground potential of the circuit and, hence, the read current by way of the reading MOSFET of the memory cell does not flow through any of them. As a consequence of the foregoing, although a MOSFET for column selection control for reading is not provided for each memory cell but a common selection method for each word line is adopted, the read port is arranged substantially in a single selection system. Thus, both the ports of the static RAM are arranged in the single selection system and, thereby, power consumption in the static RAM can be remarkably reduced.

(6) The common data line for reading is coupled with the noninverting input node of the sense circuit of the differential amplifier type wherein the load arrangement thereof is of a current mirror type, and there is provided a first shorting means between the noninverting input node and the inverting input node for transmitting the level Vr, which is attained through the charge sharing between the selected data line for reading and the common data line for reading, to the inverting input node. Since it is thereby made possible to use the D.C. level as the reference voltage of the sense circuit before the read signal is superposed thereon, a single-ended type of sense amplifier suited for the aforesaid unitized data line system and capable of stabilized operation can be realized.

(7) The sense amplifier includes a MOSFET for level correction provided between the common data line for reading and the power-source voltage of the circuit to be held in an ON state for a predetermined period after the charge sharing has been started. By means of this MOSFET, unbalance of parasitic capacitance between the data line for reading and the common data line for reading is compensated for, and the level Vr after the charge sharing is effected can be elevated to a desired level so that the operation of the sense amplifier can be maintained more stably.

(8) The sense amplifier includes a preset MOSFET for presetting the noninverting output node of the sense circuit to a high level when the read port is brought into a nonselected state. It further includes a second shorting means for temporarily shorting the noninverting output node and the inverting output node. Thereby, the output level of the sense amplifier at the time of the nonselected state can be secured and also the offset of the sense circuit is removed so that the operation of the sense amplifier can be stabilized even further.

(9) The sense amplifier includes a MOSFET with a relatively small value of conductance provided between the COMMON data line for reading and the power-source voltage of the circuit and which is maintained in an ON state while the sense circuit is in its operating state. When the stored data in the memory cell is a logical 0, although the level of the common data line for reading is left at a level Vr which is attained as a result of the charge sharing, the aforesaid MOSFET progressively pushes up this level. Thereby, the difference in level thereof with the reference level can be secured regardless of the data stored in the selected memory cell and the operation of the sense amplifier can thus become stabilized.

Figure 5:
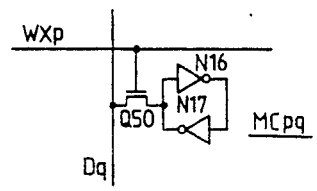
FIG. 5 is a partial circuit diagram showing a second embodiment of the memory array for a static RAM to which the present invention is applied.

FIG. 5 shows a circuit diagram of a second embodiment of a principal part of the memory array MARY of a static RAM to which the present invention is applied. In the following exemplary circuit diagrams of embodiments of the memory array MARY, a memory cell MCpq and a memory cell MCpq-1 arranged in the qth column and the (q-1)th column, respectively, of the pth row and peripheral portions of the memory array for these memory cells are shown. As to memory cells and memory array peripheral portions arranged at other addresses of the memory array MARY, they are basically in conformity with the above described first embodiment and, hence, additional descriptions will be given below only in connection with that related to the following embodiments.

Referring to FIG. 5, which illustrates only a single exemplary memory cell, the memory array MARY includes a plurality of such word lines WXp disposed in parallel in the horizontal direction, a plurality of data lines Dq disposed in parallel in the vertical direction and, correspondingly, memory cells MCpq disposed in a matrix array at the intersections of the word lines and data lines thereof.

The memory cells MCpq constituting the memory array MARY are each basically constructed of a latch formed of a pair of CMOS inverter circuits N16 and N17 arranged in a cross connection (bistable cross-coupling arrangement). Between one input and output node of the latch and its corresponding data line Dq, there is disposed a MOSFET Q50 for row selection control. The gate of this MOSFET Q50 for row selection control is coupled with its corresponding word line WXp.

The word lines WXp are coupled with an X address decoder XAD, not shown, and alternatively are brought into a selected state in response to a high level thereat. The data lines Dq are coupled, through column switches CSW, not shown, with the common data line, which in turn is coupled with a write amplifier WA and a sense amplifier SA. The write amplifier WA and the sense amplifier SA respectively include a write circuit and a read amplifier circuit of a single-ended type.

The memory array MARY of the present embodiment adopts the so-called common selection system and the static RAM is arranged to be a one port RAM. In the present embodiment, the data lines Dq are arranged in a unitized data line system and, hence, each memory cell and thus the memory array MARY are simplified in construction.

Figure 6:
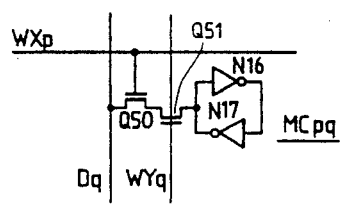
FIG. 6 is a partial circuit diagram showing a third embodiment of the memory array for a static RAM to which the present invention is applied.

FIG. 6 shows a circuit diagram of a third embodiment of principal part of the memory array MARY of a static RAM to which the present invention is applied.

Referring to FIG. 6, one input and output node of the latch formed of inverter circuits N16 and N17 is coupled with its corresponding data line Dq through a row selection control MOSFET 50 and a column selection control MOSFET 51. The gate of the row selection control MOSFET 50 is coupled with its corresponding X word line WXp and the gate of the column selection control MOSFET 51 is coupled with its corresponding Y word line WYq.

The X word lines WXp are coupled with an X address decoder XAD, not shown, and alternatively brought into a selected state in response to a high level thereat. The Y word lines WYq are coupled with a Y address decoder YAD, not shown, and alternatively are brought into a selected state when they are set at a high level. The data lines Dq are coupled, through column switches CSW, not shown, with the common data line, which in turn is coupled with a write amplifier WA and a sense amplifier SA. These write amplifier WA and the sense amplifier SA respectively include a write circuit and a read amplifier circuit of a single-ended type.

The memory array MARY of the present embodiment is arranged into the so-called single memory cell selection system by virtue of the addition of the column selection control MOSFET 51 and, hence, only the specified single memory cell is coupled with its corresponding data line Dq. Thus, only this data line is changed in level from a precharge level to a level in accordance with the stored data in the selected memory cell, while other data lines are all left at the precharge level. Therefore, the read current of the static RAM can largely be reduced and, further, by virtue of the design for the unitized data line, construction of the memory cells and the memory array MARY can be simplified. Thus, a static RAM in a single selection system whereby lower power consumption and higher level of circuit integration are attained can be realized.

Figure 7:
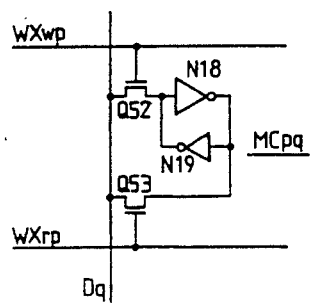
FIG. 7 is a partial circuit diagram showing a fourth embodiment of the memory array for a static RAM to which the present invention is applied.

FIG. 7 shows a circuit diagram of a fourth embodiment of principal part of the memory array MARY of a static RAM to which the present invention is applied.

Referring to FIG. 7, the memory array MARY includes word lines for writing WXwp and word lines for reading WXrp disposed in parallel in the horizontal direction in the figure and data lines Dq disposed in parallel in the vertical direction. At the points where the word lines for writing and word lines for reading intersect with the data lines, there are disposed memory cells MCpq in a matrix array.

Each of the memory cells constituting the memory array MARY is basically constructed of a latch formed of a pair of CMOS inverter circuits N18 and N19 arranged in a cross connection. In the present embodiment, while one input and output node of the latch, i.e., the node at which the input terminal of the inverter circuit N18 and the output terminal of the inverter circuit N19 are coupled together, is exclusively used as an input node, the other input and output node, i.e., the node at which the output terminal of the inverter circuit N18 and the input terminal of the inverter circuit N19 are coupled together, is exclusively used as the output node. Further, it is adapted such that, of the pair of inverter circuits constituting the latch, one inverter circuit N19 whose output terminal is coupled with the aforesaid input node is designed to have smaller driving capacity (lower gain) than the other inverter circuit N18.

The input node of the latch is coupled with its corresponding data line Dq through a row selection control MOSFET for writing Q52. The output node of the latch is also coupled with its corresponding data line Dq through a row selection control MOSFET for reading Q53. The gate of the row selection control MOSFET for writing Q52 is coupled with its corresponding word line for writing WXwp, whereas the gate of the row selection control MOSFET for reading Q53 is coupled with its corresponding word line for reading WXrp.

The word lines for writing WXwp and the word lines for reading WXrp are coupled with an X address decoder XAD, not shown, and selectively and alternatively are brought into a selected state in accordance with a high level thereat according to the operating mode of the static RAM. More particularly, when the static RAM is put in the write mode, one word line for writing WXwp is alternatively brought into a selected state, and when it is put in the read mode, one word line for reading WXrp is alternatively brought into a selected state. The data lines Dq are coupled, through column switches CSW, not shown, with the common data line, which in turn is coupled with a write amplifier WA and a sense amplifier SA. The write amplifier WA includes a write circuit and the sense amplifier SA includes a read amplifier circuit of a single-ended type.

The memory array MARY of the present embodiment adopts the so-called common selection system. Although the static RA is a one-port RAM, there are independently provided the write path and the read path for each memory cell. By virtue of the design wherein one and the other of the input and output nodes of the latch of the memory cell are exclusively used as the input node and exclusively as the output node, respectively, it is made easier to selectively arrange the driving capacity of one inverter circuit whose output terminal is coupled with the input node to be smaller than the other. As a result, the write current for the static RAM can be reduced and the writing operation can be maintained stable.

Figure 8:
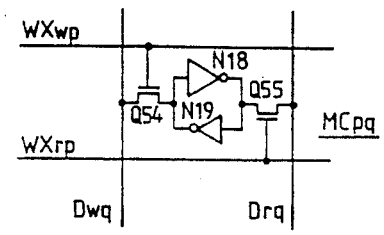
FIG. 8 is a partial circuit diagram showing a fifth embodiment of the memory array for a static RAM to which the present invention is applied.

FIG. 8 shows a circuit diagram of a fifth embodiment of a principal part of the memory array MARY of a static RAM to which the present invention is applied. The static RAM of the present embodiment is arranged in a two-port RAM and the two access ports are respectively used exclusively as a write port and a read port.

Referring to FIG. 8, the memory array MARY includes word lines for writing WXwp (first word lines) and word lines for reading WXrp (second word lines) disposed in parallel in the horizontal direction in the figure and data lines for writing Dwq (first data lines) and data lines for reading Drq (second data lines) disposed in parallel in the vertical direction. At the points where the word lines for writing and word lines for reading intersect with the data lines for writing and data lines for reading, there are disposed memory cells MCpq in a matrix array.

The memory cells MCpq constituting the memory array MARY are each basically constructed of a latch formed of a pair of CMOS inverter circuits N18 and N19 arranged in a cross connection. In the present embodiment, one inverter circuit N19 forming the latch is designed to have a smaller driving capacity than the other inverter circuit N18.

One of the input and output nodes of the latch is exclusively used as the input node thereof and is coupled with its corresponding data line for writing Dwq through a MOSFET Q54 for write control. Likewise, the other input and output node of the latch is exclusively used as the output node thereof and is coupled with its corresponding data line for reading Drq through a MOSFET Q55 for read control. The gate of the MOSFET Q54 for write control is coupled with its corresponding word line for writing WXwp and the gate of the MOSFET Q55 for read control is coupled with its corresponding word line for reading WXrp.

The word lines for writing WXwp are coupled with an X address decoder for writing XADW, not shown, of the write port and alternatively are brought into a selected state when they are set at a high level. Likewise, the word lines for reading WXrp are coupled with an X address decoder for reading XADR, not shown, of the read port and alternatively are brought into a selected state when they are set at a high level. The data lines for writing Dwq are coupled, through column switches CSW, not shown, with a common data line for writing, which in turn is coupled with the write amplifier WA. Likewise, the data lines for reading Drq are coupled, through the column switches CSW, with a common data line for reading, which in turn is coupled with the sense amplifier SA. The write amplifier WA and the sense amplifier SA respectively comprise a write circuit and a read amplifier circuit of a single-ended type.

Although the memory array MARY of the present embodiment adopts the so-called common selection system and the static RAM is a two-port RAM, the circuit configuration of the memory cells and memory array MARY is simplified by the unitization of the data line. Further, as described above, one of the input and output nodes of the memory cell is used exclusively as the input node and the other thereof exclusively as the output node and the driving capacity of one inverter circuit whose output terminal is coupled with the input node is selectively made smaller. Therefore, a static RAM fabricated at lower cost and consuming lower power can be realized and its operation can be stabilized.

Figure 9:
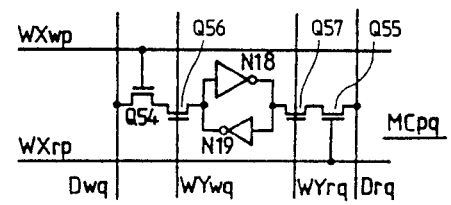
FIG. 9 is a partial circuit diagram showing a sixth embodiment of the memory array for a static RAM to which the present invention is applied.

FIG. 9 shows a circuit diagram of a sixth embodiment of a principal part of the memory array MARY of a static RAM to which the present invention is applied.

Referring to FIG. 9, the input node of the latch formed of inverter circuits N18 and N19 is coupled with its corresponding data line for writing Dwq through a row selection control MOSFET Q54 for writing and a column selection control MOSFET Q56 for writing. Likewise, the output node of the aforesaid latch is coupled with its corresponding data line for reading Drq through a row selection control MOSFET Q55 for reading and a column selection control MOSFET Q57 for reading. The gate of the row selection control MOSFET Q54 for writing is coupled with its corresponding X word line for writing WXwp and the gate of the column selection control MOSFET Q56 for writing is coupled with its corresponding Y word line for writing WYwq. Likewise, the gate of the row selection control MOSFET Q55 for reading is coupled with its corresponding X word line for reading WXrp and the gate of the column selection MOSFET Q57 for reading is coupled with its corresponding Y word line for reading WYrq.

The X word lines for writing WXwp are coupled with an X address decoder for writing XADW, not shown, of the write port and alteratively are brought into a selected state when they are set at a high level. Likewise, the X word lines for reading WXrp are coupled with an X address decoder for reading XADR, not shown, of the read port and alternatively are brought into a selected state when they are set at a high level. On the other hand, the Y word lines for writing WYwq are coupled with a Y address decoder for writing YADW, not shown, of the write port and alternatively are brought into a selected state when they are set at a high level. Likewise, the Y word lines for reading WYrq are coupled with a Y address decoder for reading YADR, not shown, of the read port and alternatively are brought into a selected state when they are set at a high level. The data lines for writing Dwq are coupled, through column switches CSW, not shown, with a common data line for writing, which in turn is coupled with a write amplifier WA. Likewise, the data lines for reading Drq are coupled, through the column switches CSW, with a common data line for reading, which in turn is coupled with a sense amplifier SA. The write amplifier WA and the sense amplifier SA respectively comprise a write circuit and a read amplifier circuit of a single-ended type.

The memory array MARY of the present embodiment is arranged in the so-called single selection system for both its write port and its read port by having the column selection control MOSFET Q56 for writing and the column selection control MOSFET Q57 for reading added thereto and, hence, the power consumption in the static RAM can be extremely reduced. Thus, a two-port static RAM in a single selection system whereby power consumption is lowered, the level of circuit integration is raised, and cost reduction is attained can be realized.

Figure 10:
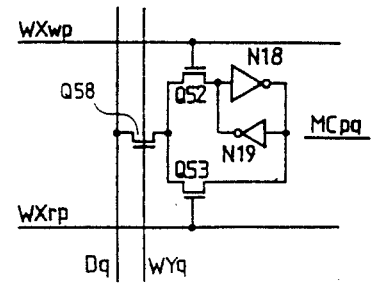
FIG. 10 is a partial circuit diagram showing a seventh embodiment of the memory array for a static RAM to which the present invention is applied.

FIG. 10 shows a circuit diagram of a seventh embodiment of a principal part of the memory array of a static RAM to which the present invention is applied. This embodiment is such that a MOSFET Q58 controlled by a Y word line Wyq is added to the embodiment of FIG. 7. Thereby, this embodiment is arranged in a single memory cell selection system of a one-port static RAM.

Figure 11:
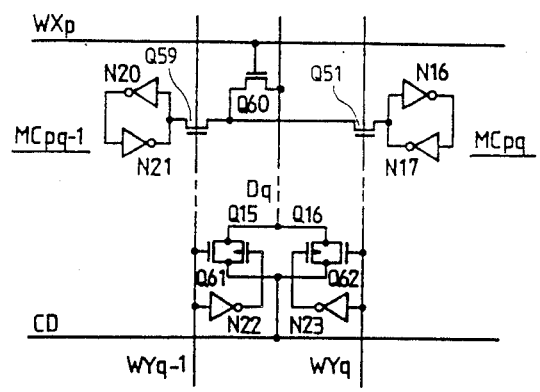
FIG. 11 is a partial circuit diagram showing an eighth embodiment of the memory array for a static RAM to which the present invention is applied.

FIG. 11 shows a circuit diagram of an eighth embodiment of a principal part of the memory array in connection with a one-port static RAM. In this embodiment, a path is commonly used for writing and reading for each memory cell. More particularly, the data line Dq is used as a data line both for reading and writing. Further, the data line Dq is commonly used for the memory cells MCpq and MCpq-1 disposed at both sides thereof.

Figure 12:
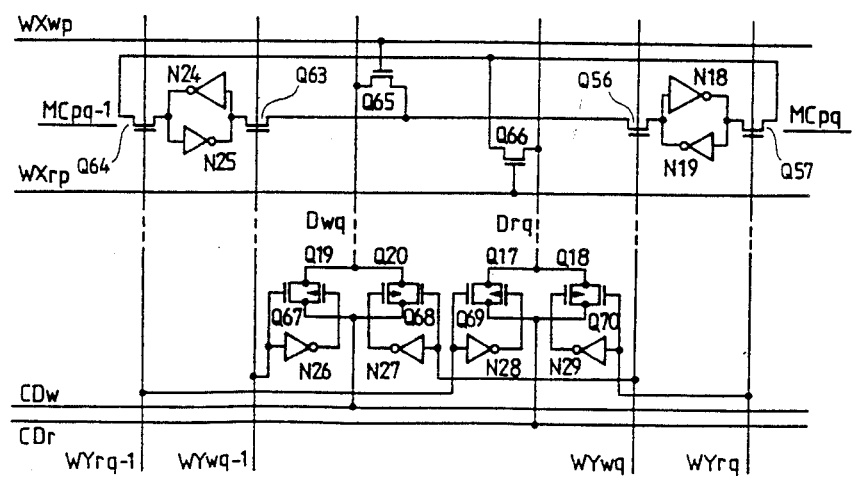
FIG. 12 is a partial circuit diagram showing a ninth embodiment of the memory array for a static RAM to which the present invention is applied.

FIG. 12 shows a circuit diagram of a ninth embodiment of a principal part of the memory array in connection with a two-port static RAM. In this embodiment, the path for writing and the path for reading are separately provided for each memory cell. More particularly, there are provided the data line for reading Drq and the data line for writing Dwq. The data line for reading Drq and the data line for writing Dwq are each commonly used for the memory cells MCpq and MCpq-1 disposed at both sides thereof.

Figure 13:
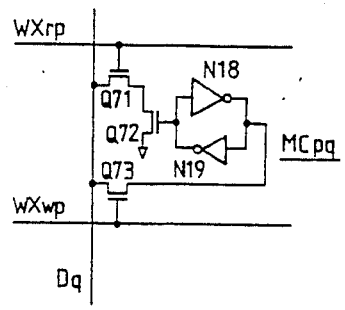
FIG. 13 is a partial circuit diagram showing a 10th embodiment of the memory array for a static RAM to which the present invention is applied.

FIG. 13 shows a circuit diagram of a 10th embodiment of a principal part of the memory array. This embodiment is such that a MOSFET Q72 is added to the embodiment of FIG. 7. Thereby, the stored data in the memory cell is prevented from being destroyed while it is read. Hence, the restriction for the precharge level of the data line Dq during a read operation and the like ca be removed and the margin of the read signal can be expanded.

Figure 14:
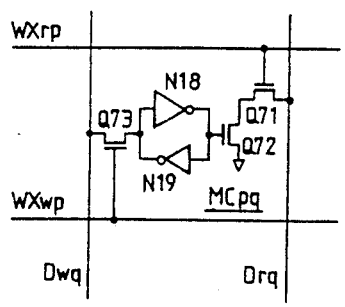
FIG. 14 is a partial circuit diagram showing an 11th embodiment of the memory array for a static RAM to which the present invention is applied.

FIG. 14 shows a circuit diagram of an 11th embodiment of a principal part of the memory array. This embodiment is such that a MOSFET Q72 is added to the embodiment of FIG. 8. Thereby, the stored data in the memory cell is prevented from being destroyed while it is read.

Figure 15:
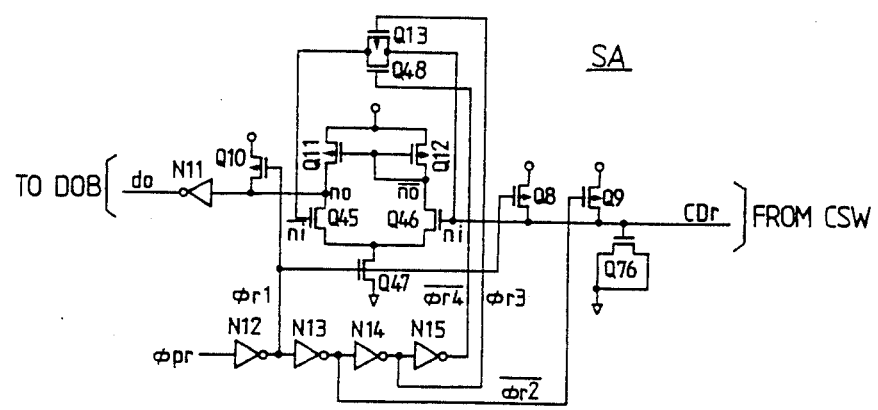
FIG. 15 is a circuit diagram showing a second embodiment of the sense amplifier for a static RAM to which the present invention is applied.

FIG. 15 shows a circuit diagram of a second embodiment of the sense amplifier SA for a static RAM to which the present invention is applied. This second embodiment will be described below with attention paid to the points therein different from the sense amplifier SA shown in FIG. 2. In these drawings, corresponding parts are denoted by corresponding reference characters.

In the present embodiment, the common data line for reading CDr is coupled with the ground potential of the circuit through a capacitance means formed of a MOSFET Q76. Here, the capacitance means is designed to have capacitance Cm expressed as $$Cm = Cd - Cc,$$

where Cd represents the parasitic capacitance of the data line for reading of the memory array and Cc represents the parasitic capacitance of the common data line for reading CDr.

Thus, the level Vs of the selected data line for reading and the common data line for reading CDr after the charge sharing becomes $$Vs = Vcc \times \frac{(Cc + CM)}{(Cc + Cm) + Cd}$$
$$= \frac{VCC}{2}.$$

Thus, in the sense amplifier SA of the present embodiment, the bias voltage of the sense circuit can be optimized without paying attention to the operating timing of the precharge MOSFET Q8.

Figure 16:
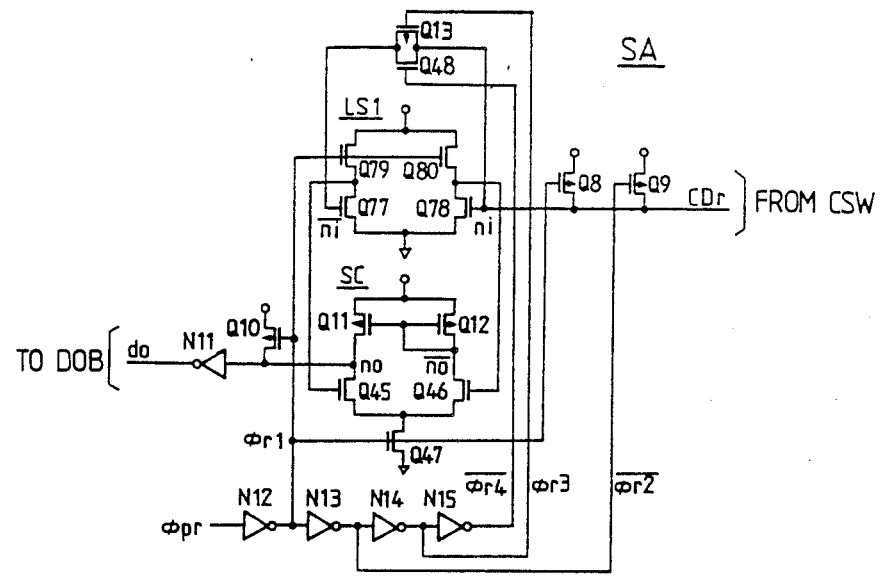
FIG. 16 is a circuit diagram showing a third embodiment of the sense amplifier for a static RAM to which the present invention is applied.

FIG. 16 shows a circuit diagram of a third embodiment of the sense amplifier SA of a static RAM to which the present invention is applied.

Referring to FIG. 16, the sense amplifier SA is basically constructed of a sense circuit SC including a pair of differential MOSFETs Q45 and Q46. The noninverting output node no of the sense circuit SC is coupled with the input terminal of an output inverter circuit N11 and also coupled with the power-source voltage of the circuit through a preset MOSFET Q10.

In the present embodiment, the sense amplifier SA is provided with a level shift circuit LS1 disposed in the preceding stage of the sense circuit SC. The level shift circuit LS1 includes a pair of differential MOSFETs Q78 and Q77, and MOSFETs Q80 and Q79, respectively disposed between the drains of the aforesaid MOSFETs and the power-source voltage of the circuit. The sources of the MOSFETs Q78 and Q77 are commonly coupled and receive thereat the ground potential of the circuit. The gate of the MOSFET Q78 is arranged to be the noninverting input node ni of the level shift circuit LS1, and it is coupled with the common data line for reading CDr and is also coupled through the MOSFETs Q8 and Q9 to receive the power-source voltage of the circuit. The noninverting input node ni of the level shift circuit LS1 is further coupled, through complementary MOSFET switch Q13-Q48, with the gate of a MOSFET Q77, i.e., the inverting input node $\overline{ni}$ of the level shift circuit LS1. The gates of the MOSFETs Q80 and Q79 are coupled together and receive the timing signal $\theta r1$. Further, the drain of the MOSFET Q78 is coupled with the gate of the MOSFET Q46, i.e., the noninverting input node of the sense circuit Sc, whereas the drain of the MISFET Q77 is coupled with the gate of the MOSFET Q45, i.e., the inverting input node of the sense circuit SC.

Thus, the level shift circuit LS1 is selectively set in an operational state in accordance with the timing signal $\theta r1$ being at a high level. At this time, the level shift circuit LS1 functions so as to amplify the level difference between the noninverting input node ni and the inverting input node $\overline{ni}$ and, further, to elevate its D.C. level by the amount corresponding to the ratio of values of conductance between the MOSFETs Q78 and Q80, or the MOSFETs Q77 and Q79.

In the sense amplifier SA of the present embodiment, the MOSFET Q8 is controlled and functions only as a precharge MOSFET for the common data line for reading CDr. In other words, the MOSFET Q8 has no function to correct the level Vs attained through the charge sharing by the selected data line for reading and the common data line for reading CDr. Therefore, the level Vs of the common data line for reading CDr, etc. after the charge sharing, becomes relatively low as described in the foregoing. The level Vs held ON until immediately before the read signal of the selected memory cell is output, is transmitted, as with the embodiment of FIG. 2, through the complementary MOSFET switch Q13-Q48, to the inverting input node $\overline{ni}$ of the level shift circuit LSI to be used as the reference potential. As a result, the read signal output through the common data line for reading CDr is transmitted to the sense circuit SC, with its D.C. level elevated to the optimum bias level Vr and its level difference from the reference potential, i.e., Vs, expanded by the level shift circuit LSI. Thus, the sense amplifier SA of the present embodiment is enabled to optimize th bias voltage for the sense circuit SC without the need for paying attention to the operating timing of the precharge MOSFET Q8 and providing a capacitance means requiring a relatively large layout area.

Figure 17:
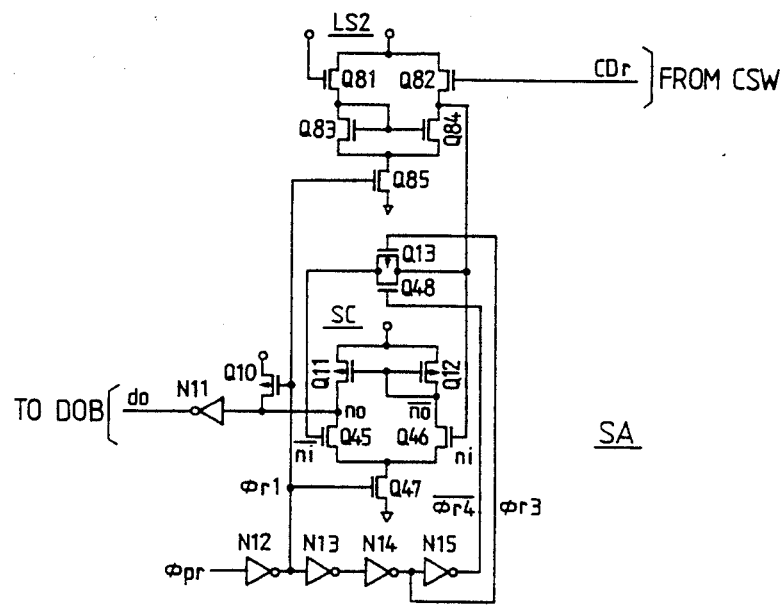
FIG. 17 is a circuit diagram showing a fourth embodiment of the sense amplifier for a static RAM to which the present invention is applied.

FIG. 17 shows a circuit diagram of a fourth embodiment of the sense amplifier SA of a static RAM to which the present invention is applied.

In the static RAM of the present embodiment, the data line for reading and the common data line for reading CDr are both precharged to such a high level as that corresponding to the power-source voltage of the circuit when the static RAM is set at a nonselected state. Hence, even after the selecting operation of the data line for reading through the column switch CSW has been finished, the D.C. levels of the selected data line for reading and the common data line for reading are held at the power-source voltage Vcc of the circuit.

In FIG. 17, the sense amplifier SA is basically constructed of a sense circuit SC including a pair of MOSFETs Q45 and Q46 the same as the embodiment of FIG. 2. The noninverting output node no of the sense circuit SC is coupled with the input terminal of the output inverter circuit N11 and also coupled with the power-source voltage of the circuit through a preset MOSFET Q10.

In the present embodiment, the sense amplifier SA is provided with a level shift circuit LS2 disposed in the preceding stage of the sense circuit SC. The level shift circuit LS2 includes a pair of differential MOSFETs Q82 and Q81, and MOSFETs Q84 and Q83, respectively disposed on the source side of the aforesaid MOSFETS. The drains of the MOSFETs Q82 and Q81 are coupled with the power-source voltage of the circuit and the sources thereof are respectively coupled to the drain of the MOSFETs Q84 and Q83 which, in turn, have their sources commonly coupled to the ground potential of the circuit through a driving MOSFET Q85. The gate of the MOSFET Q82 is coupled as the noninverting input node of the level shift circuit LS2 with the common data line for reading CDr. The gate of the MOSFET Q81 is coupled as the inverting input node of the level shift circuit LS2 with the power-source voltage of the circuit. Since, as described above, the D.C. levels of the selected data line for reading and the common data line for reading are held at the power-source voltage Vcc of the circuit in the static RAM of the present embodiment, the reference potential of the level shift circuit LS2 becomes the power-source voltage of the circuit.

The gate of the MOSFET Q83 is coupled with its drain and, further, this gate and the gate of the MOSFET Q84 are coupled together. Thereby, the MOSFETs Q84 and Q83 are arranged in a current mirror configuration. The gate of the MOSFET Q85 is supplied with the timing signal $\theta r1$. The source of the MOSFET Q82 is coupled as the noninverting output node of the level shift circuit LS2 with the noninverting input node ni of the sense circuit SC.

With such arrangement, the level shift circuit LS2 is selectively brought into an operational state upon going to a high level of the timing signal $\theta r1$. At this time, the level shift circuit LS2 has a function to amplify the difference in level between its noninverting input node, i.e., the common data line for reading CDr, and its inverting input node, i.e., the power-source voltage of the circuit and, further, a function to lower its D.C. level by the amount corresponding to the ratio of values of conductance between the MOSFETs Q82 and Q84, or the MOSFETs Q81 and Q83.

The sense amplifier SA of the present embodiment further includes a complementary MOSFET switch Q13-Q48 disposed between the noninverting input node ni and the inverting input node $\overline{ni}$ of the sense circuit SC. The complementary MOSFET switch is, as with the second embodiment, brought into an ON state when the sense amplifier SA is brought into a nonoperational state and it is brought into an OFF state immediately before the read signal from the selected memory cell is transmitted to the common data line for reading CDr after the sense amplifier SA has been brought into an operational state. At this time, the level of the common data line for reading CDr is virtually the same as the power-source voltage of the circuit and the D.C. level of the noninverting output node of the level shift circuit LS2 is brought to virtually half the power-source voltage of the circuit, i.e., the optimum bias level Vr of the sense circuit. This level is transmitted from the noninverting input ni to the inverting input node $\overline{ni}$ of the sense circuit SC during the ON state of the complementary MOSFET switch Q13-Q48 and it becomes the reference potential of the sense circuit SC. Thus, the sense amplifier SA of the present embodiment is enabled to optimize the bias voltage of the sense circuit SC without having to consider the timing to turn OFF the precharge MOSFET and providing capacitor means which would require a relatively large layout area.

Although the invention made by the present inventors has been specifically described in connection with the preferred embodiments exemplified, it is apparent that the invention is not limited to the above described embodiments but rather various modifications ar possible without departing from the spirit thereof. For example, the static RAM in FIG. 1 may be that including a plurality of memory arrays each thereof being represented by the memory array MARY in the drawing, or it may be a RAM of the so-called multiple bit type, which allows data in plural bits to be simultaneously written into or read out of the same. The memory cells constituting the memory array MARY may be the so-called high-resistance load type static memory cells, in which the P-channel MOSFET of each inverter circuit is replaced with a high resistance element. The switch MOSFETs constituting the column switch may be constructed only of the P-channel MOSFETs or the N-channel MOSFETs according to the precharge levels of the data line and the common data line or the signal level. Although, in the embodiment of FIG. 1, a pair of input and output nodes of the latch of the memory cell were arranged such that one was exclusively used as an output node and the other as an input node, either of the input and output nodes may be used as both the input node and the output node. In such a case, the logical conditions of the write signal supplied from the write amplifier WA must be inverted. In FIG. 2, although it was arranged such that the MOSFET Q8 serves the function to precharge the common data line for reading when the sense amplifier SA is brought to a nonoperational state and also serves the function to correct the level Vs of the common data line for reading, etc. after the charge sharing has been made, separate MOSFETs may be provided for each of the functions having such MOSFETs turned ON at their optimum timing. The complementary MOSFET switches Q13-Q48 and Q14-Q49 may be constructed of P-channel MOSFETs alone or N-channel MOSFETs alone. The inverter circuits N12 to N15 for forming timing signals $\theta r1$ and $\theta r3$ and inverted timing signal $\overline{\theta r2}$ and $\overline{\theta r4}$ may each be replaced as required with a multiple-stage inverter circuit. In FIG. 3, the X address decoders XADW and XADR for writing and reading and the Y address decoders YADW and YADR for writing and reading may each be disposed at both sides of the memory array MARY. Further, the data input buffer DIB and the data output buffer DOB may be omitted. In each embodiment, the MOSFET may be replaced with other type of MISFET.

In the foregoing, although the invention made by the present inventors has been described in the present application in connection with a static RAM which is to be mounted on a large-scale logical integrated circuit device as was discussed in the background section of this application, the present invention thereof is not to be considered as being limited to that. Each embodiment of the invention relative to the memory array may be implemented in connection with one which is used as a single unit of static RAM, with other static RAMs to be mounted on other digital apparatuses, or with respect to bipolar CMOS type RAMS. The single-ended type sense amplifier can be further applied to a read-only memory or to other types of semiconductor storage devices. The present invention is widely applicable to semiconductor storage devices which are at least basically constructed of static memory cells and which requires, for example, a single-ended type sense amplifier and is, furthermore, applicable to digital integrated circuit devices incorporating such semiconductor storage devices.

What is claimed is:

1. A semiconductor storage device comprising:
   an intersecting arrangement of word lines and data lines;
   a plurality of memory cells, each one being coupled to a respective word line and to a respective data line near an intersection thereof;
   first selection means for selecting one of said word lines;
   column switch means for coupling said data lines with a first common data line; and
   second selection means being coupled to said column switch means and effecting selective coupling, through said column switch means, of one of said data lines with said first common data line;
   wherein each one of said plurality of memory cells includes:
   latch means for storing data and including at least a first node,
   a first switch IGFET having a gate terminal coupled to a word line of the corresponding memory cell and having first and second input/output terminals, the first input/output terminal thereof being coupled with a data line of said corresponding memory cell, and
   a second switch IGFET having a gate terminal coupled to the first node of said latch means and having first and second input/output terminals, the first input/output terminal thereof being coupled with the second input/output terminal of said first switch IGFET, and the second input/output terminal thereof being applied with a first power-source voltage level.

2. A semiconductor storage device according to claim 1, further comprising:
   first precharge means for precharging said data lines to said first power-source voltage level; and
   second precharge means for precharging said common data line to a second power-source voltage level.

3. A semiconductor storage device according to claim 2, wherein said data lines are data lines exclusively for reading and said word lines are word lines exclusively for reading.

4. A semiconductor storage device according to claim 3, wherein said first power-source voltage level is ground voltage level and said second power-source voltage level is a positive power-source voltage level.

5. A semiconductor storage device according to claim 4, wherein in each memory cell said latch means includes said first node and a further second node where signals which are complementary with respect to each other respectively appear thereat, and
   wherein each memory cell further includes a third switch IGFET having first and second input/output terminals and a gate terminal, the first input/output terminal thereof being coupled with the second node of said latch means, the second input/output terminal thereof being supplied with data to be written and the gate terminal of said third switch IGFET having selectively applied thereat a control signal for allowing data transfer therethrough.

6. A semiconductor storage device according to claim 5, further comprising:
   column selection word lines for writing,
   wherein the gate terminal of said third switch IGFET in each one of said memory cells is coupled to a respective one of said column selection word lines for writing.

7. A semiconductor storage device according to claim 6, further comprising:
   row selection word lines for writing; and
   fourth switch IGFETs, having first and second input/output terminals and a gate terminal, wherein each fourth switch IGFET provided is correspondingly associated with at least one of said plurality of memory cells, the first input/output terminal thereof being coupled with the second input/output terminal of said third switch IGFET of said at least one memory cell, the gate terminal thereof being coupled with a respective one of said row selection word lines for writing, and the second input/output terminal thereof being supplied with data to be written.

8. A semiconductor storage device according to claim 7, wherein each one of said fourth switch IGFETs is commonly coupled with a respective pair of adjacent memory cells, disposed on either side thereof, in a row of an array comprised of rows and columns of memory cells which memory cells correspond to said plurality of memory cells.

9. A semiconductor storage device according to claim 8, wherein each said pair of adjacent memory cells corresponds to respective memory cells of a common row in a pair of adjacent columns of said array.

10. A semiconductor storage device according to claim 9, further comprising:
    data lines for writing; and
    a second common data line to which said data lines for writing are commonly coupled,
    wherein each one of said data lines for writing is coupled to the second input/output terminal of each one of said fourth switch IGFETs which are respectively coupled to each said pair of adjacent memory cells corresponding to the same pair of adjacent columns of said array.

11. A semiconductor storage device according to claim 10, further comprising:
    third selection means for selecting one of said column selection data lines for writing; and
    fourth selection means for selecting one of said row selection word lines for writing, said first selection means selecting one of said row word lines for reading.

12. A semiconductor storage device according to claim 11, wherein said column switch means includes a first plurality of complementary IGFET transfer switches and a second plurality of complementary IGFET transfer switches,
    wherein said first plurality of complementary IGFET transfer switches respectively couple said data lines for reading to said first common data line in response to a selection made by said second selection means and together with a selection of a row word line for reading in response to a selection made by said first selection means, read-out of a memory cell is effected, and wherein said second plurality of complementary IGFET transfer switches are grouped into individual parallel-connected pairs thereof, said individual parallel-connected pairs of transfer switches respectively couple said data lines for writing to said second common data line in response to a selection made by said third selection means during a write operation of said device and together with a selection made of a row selection word line for writing by said fourth selection means effecting the writing of data into a memory cell.

13. A semiconductor storage device according to claim 12, further comprising:
sensing means for sensing and amplifying the level of data read-out of said memory cells, said sensing means including an IGFET type of differential amplifier arrangement having first and second inputs, said first input thereof being coupled with said first common data line and being also coupled with a second input thereof through a short circuit means, wherein said short circuit means is brought into a transmitting state during a precharge phase of the read-out operation of said device.

14. A semiconductor storage device according to claim 13, wherein said data lines and said first common data line, when said semiconductor storage device is brought into a nonselected state, are respectively precharged to said first power-source voltage level and to a second power-source voltage level, and, when said semiconductor storage device is brought into a selected state, said first common data line is brought to a first voltage level upon selective connection of one data line with said first common data line by the selective coupling effected by said first plurality of complementary IGFET transfer switches.

15. A semiconductor storage device according to claim 2, further comprising:
a sense circuit having first and second input terminals, said first input terminal thereof being coupled with said first common data line and said second input terminal thereof being coupled with said first input terminal through shorting means selectively brought into a transmitting state.

16. A semiconductor storage device according to claim 15, wherein said data lines and said first common data line, when said semiconductor storage device is brought into a nonselected state, are respectively precharged to the first and second power-source voltage levels by said first and second precharge means, and, when said semiconductor storage device is brought into a selected state, said first common data line is brought to a first voltage level upon selective connection of one data line with said first common data line by the selective coupling effected by said column switch means.

17. A semiconductor storage device according to claim 16, wherein said shorting means is temporarily brought into a transmitting state when said common data line is brought to said first voltage level, and this first voltage level is transmitted to said second input terminal as reference potential of said sense circuit.

18. A semiconductor storage device according to claim 17, wherein said sense circuit is a current mirror type amplifier circuit and includes a first and a second IGFET of a first channel conductivity type arranged in a differential configuration, gates thereof being respectively coupled with said first and second input terminals, a third and a fourth IGFET of a second, complementary channel conductivity type arranged in a current mirror configuration and being respectively coupled, via the drain and source thereof, between the drains of said first and second IGFETs and a terminal supplied with said second power-source voltage, and a fifth IGFET being coupled between the sources of said first and second IGFETs which are coupled together and said first power-source voltage, said fifth IGFET being selectively brought into an ON state in accordance with a predetermined timing signal, and
wherein the junction where the drains of said second and fourth IGFETs are coupled together corresponds to the noninverting output terminal of said sense circuit and is coupled to an input terminal of an output inverter and also coupled with said second power-source voltage through a sixth IGFET which is brought into an ON state complementarily with said fifth IGFET.

19. A semiconductor storage device according to claim 18, further including:
a seventh IGFET of a relatively small conductance which is switched into an ON state when said sense circuit is brought into an operational state and which is coupled between said first common data line and said second power-source voltage.

20. A semiconductor storage device according to claim 18, further including:
capacitance means provided between said first common data line and said first power-source voltage, said capacitance means having a capacitance substantially corresponding to the difference between the parasitic capacitance value of each of said data lines and the parasitic capacitance value of said first common data line.

21. A semiconductor storage device according to claim 20, further including:
an eighth IGFET coupled between said first common data line and said second power-source voltage and adapted to be held ON for a period of time corresponding to a predetermined length of time within the period from when said first common data line is brought to said first voltage level to when a data signal read out of a selected memory cell is transmitted to said sense circuit.

22. A semiconductor storage device according to claim 21, wherein said first power-source voltage is ground voltage and said second power-source voltage is a positive power-source voltage.

23. A semiconductor storage device according to claim 2, further comprising:
a level shift circuit having first and second input terminals and a pair of output terminals, the first input terminal thereof being coupled with said first common data line and the second input terminal thereof being coupled with said one input terminal through shorting means which is selectively brought into a transmitting state; and
a differential sense circuit having first and second input terminals, the first input terminal thereof being coupled with one of said pair of output terminals of said level shift circuit and the second input terminal thereof being couple with the other of said pair of output terminals of said level shift circuit.

24. A semiconductor storage device according to claim 23, wherein said data lines and said first common data line, when said semiconductor storage device is brought into a nonselected state, are respectively precharged to the first and second power-source voltage levels by said first and second precharge means, and, when said semiconductor storage device is brought into a selected state, said first common data line is brought to a first voltage level upon selective connection of one data line with said first common data line by the selective coupling effected by said column switch means.

26. A semiconductor storage device according to claim 25, wherein said logic inverters have unequal driving capabilities.

25. A semiconductor storage device according to claim 24, wherein said latch means includes a pair of cross-connected logic inverters.

27. A semiconductor storage device according to claim 2, wherein said latch means includes a pair of cross-connected logic inverters.

28. A semiconductor storage device according to claim 27, wherein said logic inverters have unequal driving capabilities.

* * * * *